(12) United States Patent
Dodoc et al.

(10) Patent No.: US 7,570,343 B2
(45) Date of Patent: *Aug. 4, 2009

(54) MICROLITHOGRAPHIC PROJECTION EXPOSURE APPARATUS

(75) Inventors: Aurelian Dodoc, Oberkochen (DE); Karl Heinz Schuster, Koenigsbronn (DE); Joerg Mallmann, Oberkochen (DE); Wilhelm Ulrich, Aalen (DE); Hans-Juergen Rostalski, Aalen (DE); Hubert Holderer, Oberkochen (DE); Bernhard Gellrich, Aalen (DE); Juergen Fischer, Heidenheim (DE); Susanne Beder, Aalen (DE); Andreas Wurmbrand, Aalen-Reichenbach (DE); Ulrich Loering, Oberkochen (DE); Albrecht Ranck, Aalen (DE)

(73) Assignee: Carl Zeis SMT AG, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/285,283

(22) Filed: Nov. 23, 2005

(65) Prior Publication Data

US 2006/0187430 A1    Aug. 24, 2006

Related U.S. Application Data

(63) Continuation-in-part of application No. 10/917,371, filed on Aug. 13, 2004, which is a continuation of application No. PCT/EP2004/005816, filed on May 28, 2004.

(30) Foreign Application Priority Data

May 30, 2003   (DE)   ................................. 103 24 477
Nov. 23, 2004   (DE)   ........................ 10 2004 056 476

(51) Int. Cl.
*G03B 27/42*   (2006.01)
*G03B 27/52*   (2006.01)
*G03B 27/58*   (2006.01)
(52) U.S. Cl. .............................. 355/53; 355/30; 355/72
(58) Field of Classification Search .................. 355/30, 355/53, 72, 77; 359/819, 823, 827, 829
See application file for complete search history.

(56) References Cited

U.S. PATENT DOCUMENTS 4,269,125 A    5/1981   Mellinger (Continued)

FOREIGN PATENT DOCUMENTS

DE            221 563 A1 *   4/1985

(Continued)

OTHER PUBLICATIONS

English Translation of the German patent document DD 221 563 A1.*

(Continued)

*Primary Examiner*—Alan A Mathews
(74) *Attorney, Agent, or Firm*—Fish & Richardson P.C.

(57) ABSTRACT

A microlithographic projection exposure apparatus contains an illumination system for generating projection light and a projection lens with which a reticle that is capable of being arranged in an object plane of the projection lens can be imaged onto a light-sensitive layer that is capable of being arranged in an image plane of the projection lens. The projection lens is designed for immersion mode, in which a final lens element of the projection lens on the image side is immersed in an immersion liquid. A terminating element that is transparent in respect of the projection is fastened between the final lens element on the image side and the light-sensitive layer.

8 Claims, 18 Drawing Sheets

U.S. PATENT DOCUMENTS

| | | | |
|---|---|---|---|
| 4,346,164 | A | 8/1982 | Tabarelli et al. |
| 5,610,683 | A * | 3/1997 | Takahashi .............. 355/53 |
| 5,724,185 | A | 3/1998 | Hickey et al. |
| 6,417,974 | B1 | 7/2002 | Schuster |
| 6,479,999 | B1 | 11/2002 | DeMeester et al. |
| 6,522,390 | B2 * | 2/2003 | Suzuki et al. .............. 355/53 |
| 6,563,565 | B2 | 5/2003 | Nishi |
| 6,697,199 | B2 | 2/2004 | Gerhard et al. |
| 7,061,698 | B2 * | 6/2006 | Osterried et al. .......... 359/819 |
| 2002/0008861 | A1 | 1/2002 | Singer et al. |
| 2002/0167740 | A1 | 11/2002 | Osterried et al. |
| 2003/0011896 | A1 | 1/2003 | Shiraishi |
| 2003/0021015 | A1 | 1/2003 | Maier et al. |
| 2003/0137733 | A1 | 7/2003 | Gerhard et al. |
| 2004/0021930 | A1 | 2/2004 | Pfeiffer et al. |
| 2004/0105170 | A1 | 6/2004 | Krahmer et al. |
| 2004/0109237 | A1 | 6/2004 | Epple et al. |
| 2004/0114117 | A1 | 6/2004 | Bleeker |
| 2004/0150806 | A1 | 8/2004 | Brunotte et al. |
| 2005/0068499 | A1 | 3/2005 | Dodoc et al. |
| 2005/0225738 | A1 | 10/2005 | Shirai |

FOREIGN PATENT DOCUMENTS

| | | | |
|---|---|---|---|
| DE | 224 448 | A | 7/1985 |
| DE | 224 448 | A1 * | 7/1985 |
| DE | 199 29 403 | A1 | 12/2000 |
| DE | 101 21 346 | A1 | 11/2002 |
| DE | 101 33 841 | A1 | 2/2003 |
| EP | 0 023 231 | A1 | 2/1981 |
| EP | 0 023 243 | A1 | 2/1981 |
| EP | 1 420 302 | A | 5/2004 |
| EP | 1 431 826 | A | 6/2004 |
| JP | 10303114 | A | 11/1988 |
| JP | 6-124873 | | 6/1994 |
| JP | 10228661 | A | 8/1998 |
| JP | 10303114 | A | 11/1998 |
| JP | H 10-303114 | | 11/1998 |
| JP | 2000-058436 | | 2/2000 |
| JP | 2001-091849 | * | 4/2001 |
| WO | WO 02/093209 | A2 | 11/2002 |
| WO | WO 02/099450 | A2 | 12/2002 |
| WO | WO 03/009062 | | 1/2003 |
| WO | WO 2004/019128 | A2 | 3/2004 |
| WO | WO 2004/053959 | A1 | 6/2004 |
| WO | WO 2005/069055 | A2 | 7/2005 |
| WO | WO 2005/078773 | A1 | 8/2005 |
| WO | WO 2005/119368 | A2 | 12/2005 |

OTHER PUBLICATIONS

English Translation of JP 2001-091849 (dated Apr. 6, 2001).*

* cited by examiner

MICROLITHOGRAPHIC PROJECTION EXPOSURE APPARATUS

CROSS-REFERENCE TO RELATED APPLICATIONS

This application is a continuation-in-part of prior application Ser. No. 10/917,371 filed Aug. 13, 2004, which is a continuation of International Application PCT/EP04/005816, with an international filing date of May 28, 2004 and claiming priority of German Patent Application DE 103 24 477. This application further claims priority of German Patent Application DE 10 200 405 64 76 filed Nov. 23, 2004. The full disclosure of these prior applications is incorporated herein by reference.

BACKGROUND OF THE INVENTION

1. Field of the Invention

The present invention relates to microlithographic projection exposure apparatuses such as are used for the production of microstructured components. The invention relates, in particular, to projection exposure apparatuses with an immersion projection lens.

2. Description of Related Art

Integrated electric circuits and other microstructured components are conventionally produced by several structured layers being applied onto a suitable substrate, which may be, for example, a silicon wafer. In order to structure the layers, the latter are firstly covered with a photoresist that is sensitive to light of a particular wavelength range, for example light in the deep ultraviolet spectral region (DUV). Subsequently the wafer that has been coated in this way is exposed in a projection exposure apparatus. In this process, a pattern of diffracting structures contained in a reticle is imaged onto the photoresist with the aid of a projection lens. Since the lateral magnification in this case is generally less than 1, projection lenses of such a type are frequently also referred to as reduction lenses.

After the photoresist has been developed, the wafer is subjected to an etching process, as a result of which the layer is structured in accordance with the pattern on the reticle. The photoresist left behind is then removed from the remaining parts of the layer. This process is repeated until all the layers on the wafer have been applied.

One of the most prominent objects in the development of the projection exposure apparatuses is to be able to define lithographically structures having increasingly smaller dimensions on the wafer. Small structures result in high integration densities. This generally has a favorable effect on the performance of the microstructured components produced with the aid of apparatuses of such a type.

The size of the definable structures depends, above all, on the resolving power of the projection lens that is being used. Since the resolving power of the projection lenses is proportional to the wavelength of the projection light, one approach for the purpose of decreasing the resolving power consists in employing projection light having shorter and shorter wavelengths. The shortest wavelengths that are used at present are within the deep ultraviolet spectral region (DUV) and amount to 193 nm or occasionally even 157 nm.

Another approach for the purpose of decreasing the resolving power starts from the idea of introducing an immersion liquid having a high refractive index into an immersion interspace that remains between a final lens of the projection lens on the image side and the photoresist or another light-sensitive layer to be exposed. Projection lenses that are designed for immersion mode, and that are therefore also designated as immersion lenses, may attain numerical apertures (NA) of more than 1, for example 1.3 or 1.4. However, the immersion not only enables high numerical apertures, and thereby an increased resolving power, but also has a favorable effect on the depth of focus. The greater the depth of focus, the less demanding are the requirements as regards an exact positioning of the wafer in the image plane of the projection lens. In the broader sense, one also speaks of immersion when the light-sensitive layer is covered by an immersion liquid without the final optical element of the projection lens on the image side necessarily being immersed in the immersion liquid.

The implementation of immersion mode, however, requires considerable additional efforts in terms of structure and process engineering. For instance, it has to be ensured that the optical properties of the immersion liquid are spatially homogeneous and temporally constant—at least within the volume exposed to the projection light—even when the wafer with the photoresist applied thereon is moving relative to the projection lens. At the present time the associated technological problems have not been solved satisfactorily.

SUMMARY OF THE INVENTION

It is an object of the invention to specify a projection exposure apparatus designed for immersion mode that, with a simple structure, enables reliable and low-maintenance operation.

This object is achieved by means of a projection exposure apparatus with an illumination system for generating projection light. The apparatus further comprises a projection lens with which a reticle can be imaged onto a light-sensitive layer. The projection lens is designed for immersion mode, in which a final lens of the projection lens on the image side is immersed in an immersion liquid. According to the invention, a terminating element is provided that is transparent in respect of the projection light and is capable of being arranged between the final lens on the image side and the light-sensitive layer in such a way that it is immersed in the immersion liquid, at least with its image-side boundary surface.

The provision of a terminating element in the interspace between the final lens of the projection lens on the image side and the light-sensitive layer has, inter alia, the advantage that constituents issuing from the light-sensitive layer, or other contaminants arising there, are able to accumulate on the final lens on the image side at worst to a negligible extent, since the terminating element, in particular the side thereof facing towards the light-sensitive layer, acts like a protective shield for the final lens on the image side. In this way the final image-side lens of the projection lens does not have to be removed, but only the terminating element occasionally has to be removed and mounted again after cleaning or exchange. Particularly if the terminating element is fastened to the projection lens from outside and can be removed and mounted without disassembly of the projection lens, the effort required for this remains comparatively low.

It is advantageous if an interspace that is capable of being filled up at least partially with immersion liquid remains between the final lens of the projection lens on the image side and the terminating element. In this further embodiment the terminating element is consequently immersed in immersion liquid on both sides, so that a slight refraction of light occurs also on the boundary surface of the terminating element on the object side. The requirements as regards the adjustment and the manufacturing accuracy of the terminating element are correspondingly low. For, especially in the case of large numerical apertures, even a terminating element with plane-parallel shape reacts very sensitively to manufacturing defects, for example deviations from the nominal thickness, from the parallelism of the boundary surfaces and fitting errors.

If the interspace is not filled completely with immersion liquid but only partially, a gas-filled region remains between the immersion liquid and the final lens on the image side. This may be advantageous, for example, when the projection lens is to be capable of being converted between dry operation and immersion mode with as little effort as possible. The fewer interspaces between fixed optical elements such as lenses or terminating elements are filled with immersion liquid, the less effect a change-over to immersion mode generally has on the adjustment of the projection lens. From this point of view it may even be advantageous not to allow the projection lens to be immersed in the immersion liquid, but to leave a gas-filled region between the terminating element and the immersion liquid.

In an advantageous further embodiment of this configuration the projection lens exhibits, for the purpose of introducing immersion liquid into the interspace between the final lens on the image side and the terminating element, a first immersion device which is independent of a second immersion device for introducing immersion liquid into the interspace between the final optical element and the light-sensitive layer, so that no exchange of immersion liquid between the interspaces is possible. In this way it is ensured that contaminants issuing from the light-sensitive layer are unable to reach the final lens of the projection lens on the image side via the immersion liquid.

In another advantageous configuration the terminating element has the same refractive index as the final lens of the projection lens on the image side and is optically coupled onto this lens with its object-side boundary surface in such a way that projection light passing through the projection lens is not refracted between the final lens on the image side and the terminating element. The absence of any refraction between the final lens and the terminating element results in a still smaller adjustment effort in the course of exchanging the terminating element. This can be realized, for example, by the final lens on the image side, the terminating element and also the immersion liquid located in between them having the same refractive index.

A refraction of the projection light between the final lens on the image side and the terminating element is also forestalled when the terminating element is optically contacted with the final lens on the image side and both elements have the same refractive index. But optical contacting is also useful, in appropriate circumstances, in the case of differing refractive indices, since in this way the final lens on the image side is directly protected against contaminants by the terminating element which is optically contacted therewith. The terminating element can be optically contacted with the final lens on the image side in particularly simple manner if the two boundary surfaces facing towards one another are flat. An adjustment is then superfluous, since the position of the terminating element along the optical axis and also the orientation in the plane perpendicular thereto are predetermined by the flat boundary surfaces.

In an advantageous configuration a first interspace that is capable of being filled up with a first immersion liquid remains between the final lens of the projection lens on the image side and the terminating element. A second interspace that is capable of being filled with a second immersion liquid remains between the terminating element and the light-sensitive layer. The first interspace in this configuration is consequently capable of being separated from the second interspace in fluidically sealing manner.

The first immersion liquid and the second immersion liquid do not necessarily have to be different. But the use of differing immersion liquids has the advantage, inter alia, that the immersion liquids can be optimally adapted to the specific conditions in the two interspaces. The first immersion liquid, which is in contact with the final lens of the projection lens on the image side, may for example have a very low surface tension, which for the second immersion liquid coming into contact with the light-sensitive layer would no longer be acceptable. The first immersion liquid also does not definitely have to be so easily cleanable as the second immersion liquid, since it cannot be contaminated by the light-sensitive layer. An adaptation of the two immersion liquids from the point of view of chemical reactivity can furthermore be undertaken. Since, for example, quartz glass and calcium-fluoride crystals interact differently with adjoining liquids, the immersion liquids may be selected in such a way that they react chemically as little as possible with the adjoining optical faces.

The terminating element in this configuration may be arranged in displaceable manner. This makes it possible to distribute the shear forces acting on the immersion liquid, which arise as a result of the relative movement between the fixed projection lens and the light-sensitive layer, between the first immersion liquid and the second immersion liquid in a practically arbitrary ratio.

If during a scanning operation of the projection exposure apparatus the terminating element is displaced synchronously with the light-sensitive layer, constant distributions of force in the immersion liquids can be achieved over the entire scanning operation. This favors the formation of laminar flows of liquid, counteracting the formation of bubbles. This applies, in particular, if the terminating element is displaced in a plane parallel to the light-sensitive layer.

With regard to minimal movements of the second immersion liquid, the terminating element and the light-sensitive layer may have like displacement speeds and displacement directions during a projection. There is then no longer any relative movement between the terminating element and the light-sensitive layer. The second immersion liquid then remains with freedom of movement within the second interspace, despite the common displacement movement of the light-sensitive layer and of the terminating element. For this reason it may also have a higher viscosity than the first immersion liquid.

If flows within the second immersion liquid still arise, these have their origin in inertial forces which appear in the course of acceleration and deceleration during a scanning operation. If these inertial forces are small enough, additional measures, which are otherwise necessary in order to keep the immersion liquid in the interspace between the final lens on the image side and the light-sensitive layer, can be dispensed with. Since these measures generally promote bubbling, this configuration of the invention permits bubbles in the region of the second immersion liquid to be very largely avoided.

Although in the region of the first immersion liquid a relative movement occurs between the projection lens and the terminating element in the course of a scanning operation, and as a result shear forces also arise that act on the first immersion liquid, the terminating element may, unlike the wafer, be provided with an edge which prevents an undesirable discharging of the first immersion liquid during scanning operation. Therefore also for the first immersion liquid no additional measures, such as, for instance, an incident flow of gases, are necessary in order to prevent a discharging of the immersion liquid. Consequently bubbles cannot arise, or cannot arise to an appreciable extent, in the first immersion liquid either.

The edge may be formed directly on the terminating element. The edge may also be part of a tank which is open in the direction towards the final lens of the projection lens on the image side and in the bottom of which the terminating element is arranged. The tank itself may then consist of an opaque material, for example a metal or a crystal. Crystals such as crystalline silicon, for example, have the advantage of being very dimensionally stable. On account of their low specific weight, their stiffness and their low chemical reactivity, ceramics, for example based on SiC, are also highly suitable as material for the tank. The terminating element, which, for example, may consist of quartz glass, then forms merely a type of window at the bottom of the tank, through which the projection light can pass.

In addition to having translational displaceability, the terminating element may also be capable of being tilted about a tilt axis parallel to the image plane. The tiltability constitutes an additional degree of freedom, with which movements of the first and second immersion liquids can be influenced.

If the terminating element is, for example, tilted during a positioning movement in an exposure intermission in such a way that the largest spacing between the terminating element and the light-sensitive layer is situated at the front in the direction of motion, a kind of wedge-shaped gap arises between the terminating element and the light-sensitive layer. In this gap the second immersion liquid is entrained in the course of a positioning movement of the wafer over and beyond the light-sensitive layer. The tilting movement in this case may be effected in such a way that the shortest spacing between the terminating element and the light-sensitive layer is so small that, as a consequence of cohesive forces, the second immersion liquid is unable to pass through this gap. By virtue of this it is possible to displace the second immersion liquid over the surface of the wafer in very simple manner, also over greater distances and at greater speeds.

If an edge is provided on the terminating element, said edge should be dimensioned in such a way that in the course of a tilting movement of the terminating element the second immersion liquid is nevertheless prevented by the edge from discharging. Hence also in the course of positioning movements of the wafer, which are generally carried out at greater speeds than the displacement movements during an exposure, the necessity of entraining an immersion liquid with the aid of incident flows of gases, or with similar measures, also ceases to apply. Consequently no appreciable formation of bubbles can occur, even in the course of positioning movements.

Alternatively, or also in addition to tiltability of the terminating element, there may be provision to displace the terminating element perpendicular to the image plane. The spacing between the light-sensitive layer and the terminating element may then, for example, be reduced so far that the immersion liquid remains in the second interspace solely by virtue of cohesive forces.

If the second immersion liquid cannot be kept in the vicinity of the final lens on the image side merely by virtue of the cohesive forces or by virtue of a tilting of the terminating element in the course of a movement of the wafer relative to the projection lens, a holding device known as such may additionally be provided, which holds the second immersion liquid in the second interspace in non-contacting manner. For this purpose the holding device may comprise, for example, at least one gas nozzle, the discharge aperture of which can be directed towards the second immersion liquid.

In another advantageous configuration of the invention, at least the first interspace is arranged in a sealable container. The container may be, for example, a type of housing which is penetrated by the projection lens and which covers the entire supporting structure for the wafer. As a result of evaporation of the immersion liquid, after some time a saturation vapor pressure arises within the container, which prevents more immersion liquid from evaporating than condenses again simultaneously. In this way, latent heat of evaporation may not arise at those places where the immersion liquid comes into contact with a surrounding gas. Heat-sinks of such a type bring about an inhomogeneous distribution of temperature and hence also an inhomogeneous distribution of refractive index of the immersion liquid, as a result of which the imaging properties are impaired.

In general, however, it takes a very long time until the saturation vapor pressure has arisen in the container merely as a result of evaporation on the relatively small surface. Therefore the projection exposure apparatus may comprise a supply device for supplying a vapor phase of the first immersion liquid in the container. Even if the first immersion liquid differs from the second immersion liquid, in general it is not necessary also to counteract an evaporation of the second immersion liquid, since as a consequence of the terminating element the interface to a surrounding gas is very small.

A minimal cooling of the first immersion liquid is obtained when the vapor pressure of the vapor phase of the first immersion liquid in the container is capable of being adjusted in such a way that it is at least approximately equal to the saturation vapor pressure of the vapor phase of the first immersion liquid at the temperature prevailing in the container.

Another possibility for forestalling fluctuations of temperature within the first immersion liquid as a consequence of local evaporation consists in covering the first interspace in the upward direction at least partially by means of a cover. The cover reduces the size of the interface to a surrounding gas, on which cooling can occur as a result of evaporation. This cover may, for example, be constructed in such a way that only a small interspace filled with a gas remains between the cover and the first immersion liquid. The saturation vapor pressure arises relatively quickly there as a result of evaporation.

But the gas in the interspace may also be a special protective gas, the density of which is greater than the density of a surrounding gas. As a consequence of the greater density, the protective gas is kept in the interspace by the force of gravity. The protective gas should furthermore be such that the solubility thereof in the second immersion liquid is as low as possible, preferably lower than $10^{-4}$ percent by volume. In this way an undesirable diminution of the transmitting power, or changes in refractive index within the second immersion liquid that have their origin in protective gas that has gone into solution, can be counteracted.

It is more favorable if the first immersion liquid directly adjoins the cover, so that an interface to a surrounding gas or to the aforementioned protective gas remains only where the cover is interrupted.

This may be the case, for example, in the region of a recess which is provided in the region of the final lens on the image side. The cover does not then touch the projection lens; at the same time, an equalisation of level may take place via the peripheral gap between the lens and the cover, so that the volume between the terminating element and the cover is always completely filled with the first immersion liquid.

In this connection it is particularly favorable if the tank has an edge that slides in sealing manner along the underside of the cover during the displacement movement of the terminating element. The edge prevents, on the one hand, a lateral discharging of the first immersion liquid. At the same time, with its upward-pointing lateral face it forms a seal acting in the direction towards the cover.

A liquid film consisting of the first immersion liquid and acting as a lubricating seal may always remain between an upward-pointing lateral face of the edge and the cover. In order that this liquid film does not break away during a movement of the tank, a liquid reservoir may be sunk in the upward-pointing lateral face of the edge, out of which immersion liquid can subsequently flow. The immersion liquid may be under pressure in the liquid reservoir, so that the liquid film does not break away even when the relative movement between the tank and the cover generates an underpressure in the marginal region of the edge. The pressure in the liquid reservoir may, for example, be generated by first immersion liquid being capable of being supplied under pressure to the liquid reservoir from outside the tank.

In order to collect small amounts of the first immersion liquid which pass through the narrow gap between the edge of the tank and the cover and which display a lubricating action, on at least one outer side of the edge an overflow channel may be arranged which collects the overflowing first immersion liquid and conducts it away.

In addition, in all the aforementioned configurations the terminating element may have has at least approximately the same refractive index as the first and second immersion liquids. In this way it is ensured that small maladjustments of the terminating element barely have any effect on the optical properties of said liquids. For this reason the refractive index of the terminating element may differ from the refractive index of the adjoining immersion liquids by no more than 1% and preferably by no more than 0.5%.

This can be obtained, for example, by the adjoining immersion liquids being water and by the terminating element consisting of LiF.

It is particularly favorable if the terminating element is without refractive power. "Without refractive power" here is to be understood to mean the property of an optical element of having no focusing or defocusing effect. An example of such an optical element is a plane-parallel plate made of a homogeneous material. Such a plate does in fact have an effect on the position of the image plane of the projection lens and on the correction of the spherical aberration and must to this extent be taken into account in the design of said projection lens. However, provided that a difference in refractive index exists at the boundary surfaces, such a plate offsets beams impinging at an angle merely in parallel, the magnitude of the offset depending on the angle of incidence. A terminating element without refractive power is advantageous for the reason that, in this way, the requirements regarding the adjustment thereof can be lowered further and consequently the adjustment effort after a cleaning or an exchange of the terminating element is again reduced.

Quartz glass, for example, enters into consideration by way of material for the terminating element. Since in the case of very short-wave projection light in the deep ultraviolet spectral region, in particular at a wavelength of 157 nm, quartz glass and other conventional optical materials are no longer sufficiently transparent, the use of calcium-fluoride, barium-fluoride or strontium-fluoride crystals or even of mixed crystals such as calcium barium fluoride, for instance, has been proposed as a substitute. These materials also enter into consideration for the terminating element. However, these cubic crystals exhibit an intrinsic birefringence which results in an impairment of the imaging properties of the projection lens unless appropriate countermeasures are taken.

For this reason the terminating element may comprise at least two members consisting of one of the stated crystals, the thicknesses of which are so chosen, and the crystal lattices of which are so orientated relative to one another, that the influence of intrinsic birefringence on projection light passing through is at least approximately compensated.

The members may, for example, be joined to one another seamlessly or may even be spaced from one another in the direction of the optical axis. In the last-mentioned case an interspace remaining between the members, which may be sealed all round, can likewise be filled with a liquid that is transparent for the projection light. The faces adjoining the interspace between the members do not definitely have to be flat but may also exhibit a curvature. If the face of the object-side partial element pointing towards the interspace is concave and/or if the face of the image-side members pointing towards the interspace is convex, then a good compensation of the intrinsic birefringence can be achieved also for beams that pass through the terminating element inclined at large aperture angles.

In another advantageous configuration of the invention, at least one face of the terminating element passed through by projection light is reworked by local removal of material with a view to correcting wavefront errors. This process, which is known as such, of compensating for wavefront deformations by slight removal of material, of the order of magnitude of a few nanometres, can be employed particularly effectively in the case of the terminating element, since the latter is located in the immediate vicinity of the image plane. In this connection it is to be noted that the quotient of the refractive indices of the terminating element and of the immersion liquid is less than in dry systems without immersion liquid, so that correspondingly more material has to be removed in order to achieve the same effect as in dry systems. Particularly when the terminating element is a plane-parallel plate, the reworking of one or both faces turns out to be particularly easy.

In another advantageous configuration of the invention a protective layer that is impermeable in respect of immersion liquid is applied onto at least one surface of the terminating element that is able to come into contact with immersion liquid. Such a protective layer is advantageous in particular when fluoride crystals are used as material for the terminating element, since these crystals exhibit a relatively high solubility in water. As a result of the application of a layer of such a type, the material can be prevented from being corroded if water or a substance containing water is used by way of immersion liquid. The application of such a protective layer is advantageous not only in conjunction with a terminating element but quite generally in the case of all optical elements consisting of cubic fluoride crystals, particularly in the case of calcium-fluoride crystals that may come into contact with the immersion liquid.

In the course of the application of a protective layer, care should be taken to ensure that the latter completely covers the face to be protected. Even extremely small openings in the protective layer may result in a penetration of immersion liquid and in the formation of underlayer corrosion. From this point of view, an ion-assisted deposition of a protective layer of extremely high compactness (preferably greater than 98%) is advantageous, since as a result a local detachment of the protective layer in the course of operation of the projection exposure apparatus is largely prevented. The "compactness" of a material here is to be understood to mean, for a given degree of crystallinity, the ratio of the specific density of the material to a reference density at which the material is perfectly free from cavities.

BRIEF DESCRIPTION OF THE DRAWINGS

Further advantages and features of the invention will become apparent from the following description of the exemplary embodiments on the basis of the drawing. Shown therein are.

DESCRIPTION OF PREFERRED EMBODIMENTS

Figure 1:
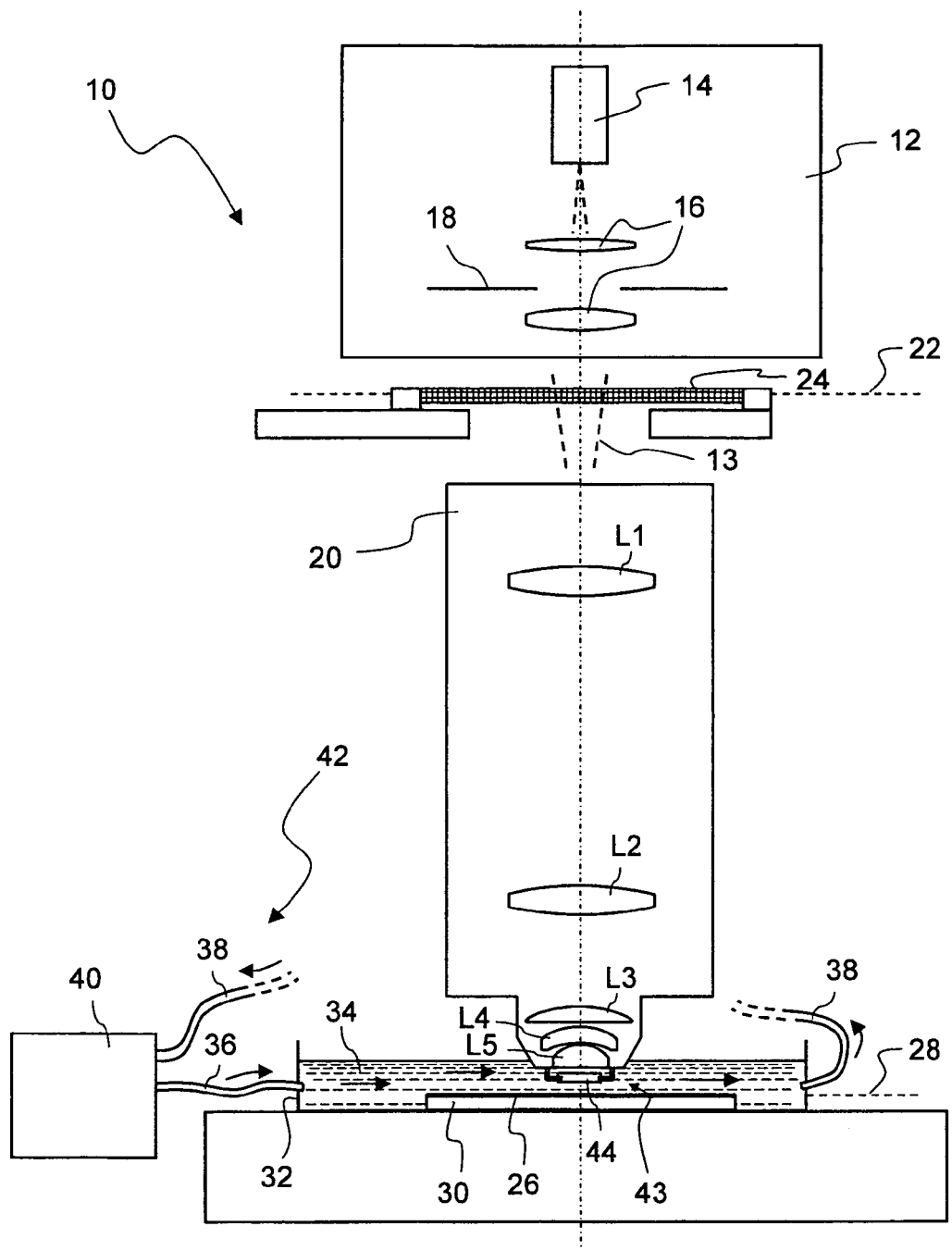
FIG. 1 a meridional section through a projection exposure apparatus according to a first exemplary embodiment of the invention in greatly simplified, not-to-scale, schematic representation.

FIG. 1 shows, in greatly simplified schematic representation, a meridional section through a microlithographic projection exposure apparatus denoted overall by 10 according to a first exemplary embodiment of the invention. The projection exposure apparatus 10 exhibits an illumination system 12 for generating projection light 13, which, inter alia, comprises a light source 14, illuminating optics indicated by 16, and a diaphragm 18. In the exemplary embodiment that is represented, the projection light has a wavelength of 157 nm.

The projection exposure apparatus 10 further includes a projection lens 20 which contains a plurality of lenses, only a few of which, for the sake of clarity, are represented in exemplary manner in FIG. 1 and denoted by L1 to L5. By reason of the short wavelength of the projection light 13, the lenses L1 to L5 are fabricated from calcium-fluoride crystals, which are still sufficiently transparent even at these wavelengths. The projection lens 20 serves to image, in reduced manner, a reticle 24 which is arranged in an object plane 22 of the projection lens 20 onto a light-sensitive layer 26 which is arranged in an image plane 28 of the projection lens 20 and applied on a support 30.

The support 30 is fastened to the bottom of a tank-like container 32 which is open in the upward direction and which is capable of being displaced, in a manner not represented in any detail, parallel to the image plane 28 with the aid of a displacing device. The container 32 is filled up so far with an immersion liquid 34 that during operation of the projection exposure apparatus 10 the projection lens 20 is immersed in the immersion liquid 34 with its final lens L5 on the image side. In the exemplary embodiment that is represented, this lens L5 is a large-aperture and comparatively thick lens; but here a plane-parallel plate is also to be encompassed by the term "lens".

Via a supply line 36 and a drainage line 38 the container 32 is connected to a conditioning unit 40 in which a circulating pump, a filter for cleaning immersion liquid 34, and also a temperature-control device are contained in a manner known as such and therefore not represented in any detail. The conditioning unit 40, the supply line 36, the drainage line 38 and also the container 32 form overall an immersion device denoted by 42 in which the immersion liquid 34 is circulated and in the process cleaned and kept at constant temperature. The immersion device 42 serves, in a manner known as such, for increasing the resolving power and/or the depth of focus of the projection lens 20.

In an interspace 43 remaining between the final lens L5 on the image side and the light-sensitive layer 26 a terminating element 44 is arranged, the details of which will be elucidated in the following on the basis of FIG. 2.

Figure 2:
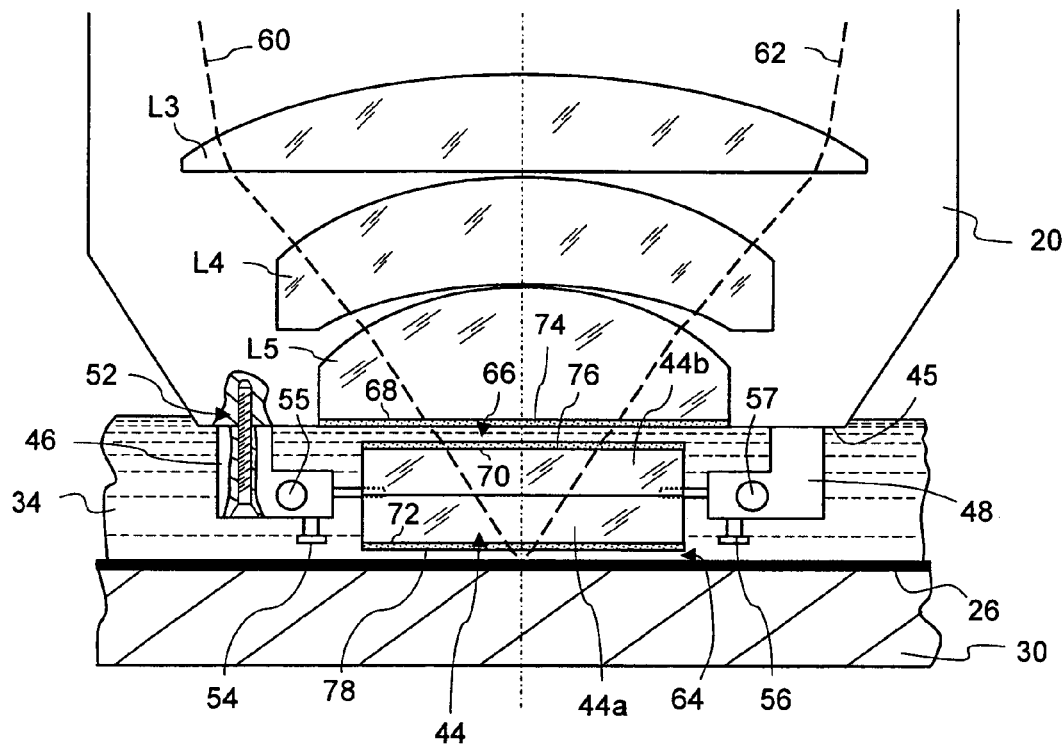
FIG. 2 an enlarged detail from the image-side end of a projection lens which is an integral part of the projection exposure apparatus shown in FIG. 1.

FIG. 2 shows the image-side end face 45 of the projection lens 20 in an enlarged detail from FIG. 1. In the enlarged representation it can be discerned that the terminating element 44 has the shape of a plane-parallel plate with, for example, a circular or rectangular base area and is separably and adjustably attached to the image-side end face 45 of the projection lens 20 via two fastening elements indicated by 46 and 48. With a view to illustrating the separability, a screw connection 52 is indicated at the fastening element 46. For the purpose of adjustment, fine-adjustment drives are provided which are indicated in FIG. 2 by micrometer screws 54, 55, 56 and 57.

The terminating element 44 comprises two plate-like members 44a and 44b connected to one another, which have the same dimensions and which bear against one another seamlessly. By reason of the short wavelength of the projection light 13, the two members 44a and 44b are also each fabricated from calcium-fluoride crystals. The crystal lattices of the two members 44a, 44b are orientated in such a way that a rotationally symmetrical distribution of intrinsic birefringence results overall for the terminating element 44. As an alternative to this, the terminating element 44 may also comprise more than two members with differing crystal orientations. With a total of four plane-parallel members it is, for example, possible to compensate for the delay caused by intrinsic birefringence to a very large extent for arbitrary directions of incidence. Examples of the crystal orientations considered here can be gathered, for example, from WO 02/093209 A2, from WO 02/099450 A2 and also from U.S. 2003/0011896 A1. The full disclosure of these applications is incorporated herein by reference.

In the case of the first exemplary embodiment shown in FIG. 2 the immersion liquid 34 flows around the exchange element 44 from all sides and is located, in particular, in the two gap-like interspaces 64 and 66 which remain between the terminating element 44, on the one hand, and the light-sensitive layer 26 or the final lens L5 on the image side, on the other hand.

If emission of substances from the light-sensitive layer 26, or a mechanical detachment of relatively small parts thereof, occurs during the operation of the projection exposure apparatus 10, then the terminating element 44 prevents contaminants contained in the immersion liquid 34 from being able to reach the flat image-side boundary surface 68 of the final lens L5 of the projection lens 20 in unhindered manner. Although such a contact is also not totally ruled out, since the two gap-like interspaces 64 and 66 are not completely separated from one another, an exchange of liquid between the gap-like interspaces 64 and 66 is at least made considerably more difficult by the terminating element 44 situated in between. For this reason, contaminated immersion liquid 34 practically does not ascend to the final lens L5 but is predominantly supplied via the drainage line 38 to the conditioning unit 40 and cleaned therein.

By reason of the protective effect of the terminating element 44 it is hardly still necessary to exchange the final lens L5 on account of contamination by contaminated immersion liquid 34 and, in connection therewith, to adjust it in elaborate manner.

An exchange of the terminating element 44, on the other hand, which is exposed in far higher measure to the contaminants emanating from the light-sensitive layer 26, turns out to be comparatively easy. For, in order to do this, the fastening elements 46 and 48 merely have to be loosened from the housing of the projection lens 20 with the aid of the screw connections 52. The installation of the terminating element 44, which immediately follows a cleaning or an exchange, also requires little adjustment and is therefore easy. By reason of the design in the form of a plane-parallel plate, the terminating element 44 is without refractive power and therefore has only comparatively little effect on the imaging properties. This holds, in particular, also for the reason that the terminating element 44 floats in the immersion liquid 34, so that, given suitable choice of the immersion liquid, only a very slight or even infinitesimal refractive effect arises at the boundary surfaces exposed to the projection light 13.

For all the optical elements that are fabricated from fluoride crystals and that are able to come into contact with immersion liquid a protective layer is applied, preferably at least on the optically active faces, which protects the sensitive crystals from the immersion liquid. In the first exemplary embodiment represented in FIG. 2, protective layers 74, 76 and 78 of such a type are therefore applied onto the flat image-side boundary surface 68 of the lens L5 and also onto the upper side 70 and onto the underside 72 of the terminating element 44.

The choice of the materials for the protective layers 74, 76 and 78 depends, above all, on the immersion liquid that is employed, which in turn is chosen taking the wavelength of the projection light that is being used into account. In the case of light wavelengths of 193 nm, water, for example, enters into consideration by way of immersion liquid, which rapidly corrodes crystalline calcium fluoride on account of the relatively high solubility thereof in water. In this case the protective layers 74, 76, 78 may consist of $SiO_2$ or $LaF_3$, since these materials are not soluble in water.

In the case of a light wavelength of 157 nm, as used in the exemplary embodiment described above, certain oils have a higher transparency than water and are therefore better suited by way of immersion liquid. The likewise highly transparent materials $MgF_2$ and $LaF_3$, for example, then enter into consideration as materials for the protective layers 74, 76, 78.

The protective layers 74, 76, 78 consisting of the stated materials can be applied onto the boundary surfaces of the optical elements in question by evaporation coating in a vacuum.

Figure 3:
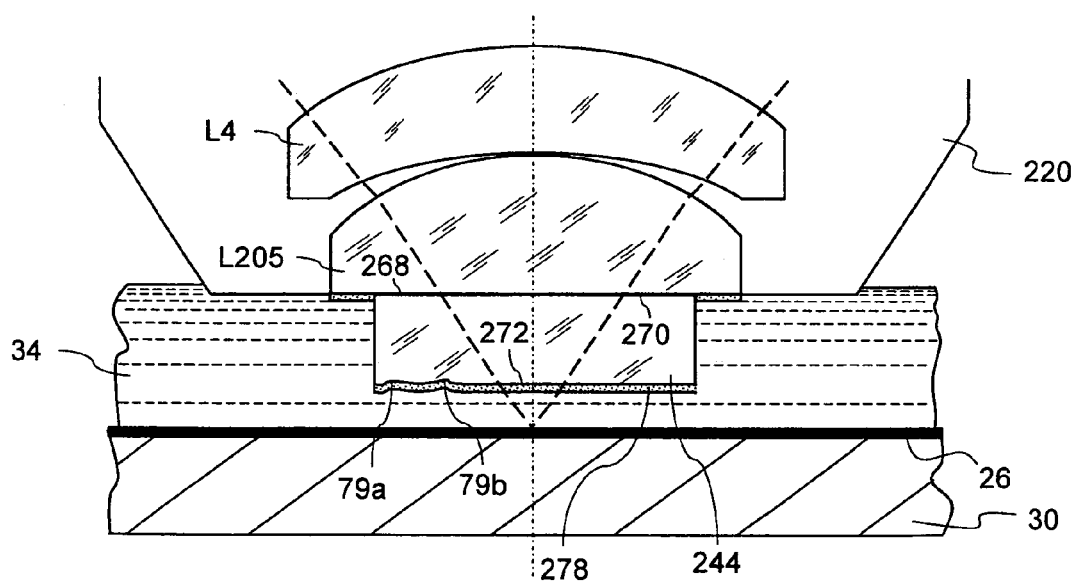
FIG. 3 a projection exposure apparatus according to a second exemplary embodiment of the invention in a representation corresponding to FIG. 2, wherein the terminating element is optically contacted with the final lens on the image side.

FIG. 3 shows, in a representation based upon FIG. 2, a second exemplary embodiment of a microlithographic projection exposure apparatus, wherein for like parts use is made of the same reference numerals as in FIG. 2 and for parts corresponding to one another use is made of reference numerals augmented by 200. In the second exemplary embodiment the terminating element 244 is not separated from the final lens L205 on the image side via an interspace 66 but is optically contacted with said lens directly. Provided that the lens L205 and the terminating element 244 are fabricated from a material having the same refractive index, the projection light 13 passes through the boundary surface between the terminating element 244 and the final lens L205 without being refracted. The fastening by optical contacting has the advantage that no fastening elements 46, 48 are required. In addition, after an exchange the terminating element 244 practically does not need to be adjusted, since the two flat boundary surfaces 270 and 268 facing towards one another pertaining to the terminating element 244 and to the lens L205, respectively, guarantee the correct arrangement by themselves in the course of optical contacting.

The image-side face 272 of the terminating element 244 is reworked at some points 79a, 79b—represented in FIG. 3 on a greatly exaggerated scale—by removal of material amounting to a few nanometres in such a way that wavefront errors caused by the projection lens 220 are corrected. Since reworking methods of such a type are known as such, a more detailed elucidation will be dispensed with.

Figure 4:
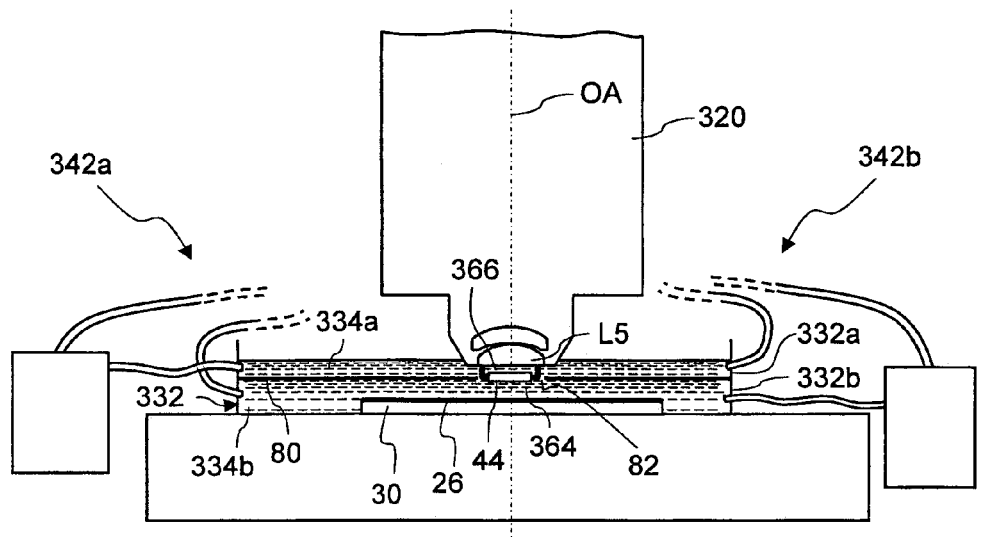
FIG. 4 a projection exposure apparatus with an additional horizontal partition according to a third exemplary embodiment of the invention in a detail representation corresponding to FIG. 1.

FIG. 4 shows, in a representation based upon FIG. 1, a third exemplary embodiment of a projection exposure apparatus, wherein for like parts use is made of the same reference numerals as in FIG. 1 and for parts corresponding to one another use is made of reference numerals augmented by 300. The projection exposure apparatus shown in FIG. 4 differs from that shown in FIG. 1 in that it comprises not just one but two immersion devices 342a and 342b which are independent of one another. The container 332 here is subdivided horizontally by a partition 80 into two partial containers 332a and 332b in such a way that the gap-like interspace 366 between the terminating element 44 and the final lens L5 on the image side is arranged totally within the partial container 332a, and the gap-like interspace 364 between the terminating element 44 and the light-sensitive layer 26 is arranged totally within the partial container 332b. The terminating element 44 is sunk with clearance in a suitably shaped cut-out 82 in the partition 80 between the partial containers 332a and 332b.

By virtue of the separation of the immersion liquids 334a and 334b in separate immersion devices 342a and 342b, contaminated immersion liquid 334b from the partial container 332b is prevented from getting into the gap-like interspace 366 between the terminating element 44 and the lens L5 and from being able to contaminate the latter in this way.

Further, the independent immersion devices 342a, 342b make it possible to control the temperature of the immersion liquids 334a and 334b independently. Thus the refractive of the liquids 334a, 334b may be independently controlled with the help of the immersion devices 342a, 342b. For example, the temperature of the immersion liquid 342a adjacent the final lens L5 may be used for controlling the temperature of the terminating element 44 and/or the final lens L5, and the immersion liquid 334b adjacent the light-sensitive surface 26 may be used for adapting the indices of refraction, for example to the immersion liquid 334a, to other immersion liquids or to the light-sensitive surface 26.

In the following a fourth exemplary embodiment will be described on the basis of FIGS. 5 and 6, which show schematically a detail from the image-side end of a projection lens, and an enlarged detailed representation thereof, respectively. Parts similar to those in FIGS. 1 to 4 are denoted by like reference numerals, and parts corresponding to one another are denoted by reference numerals augmented by 400.

In the fourth exemplary embodiment a terminating element 444 is provided parallel to the image plane 28. The terminating element 444 is likewise constructed in the form of a plane-parallel plate which, however, is considerably larger than in the exemplary embodiments described above. In the exemplary embodiment that is represented, the terminating element 444 has a rectangular basic shape and is sunk into a bottom 486 of a tank 488. The tank 488, which, for example, may be fabricated from metal, a ceramic or a crystal, serves for receiving a first immersion liquid 434a, which in the exemplary embodiment that is represented is de-ionised water. An edge 490 of the tank 488 is so high that, given an appropriate filling height of the first immersion liquid 434a, a first interspace 492 remaining between the final lens L5 on the image side and the terminating element 444 is filled out completely with the first immersion liquid 434a.

Between the terminating element 444 and the light-sensitive layer 26 there remains a flatter second interspace 494 which is filled with a second immersion liquid 434b. In the exemplary embodiment that is represented, the second immersion liquid 434b is likewise de-ionised water. The second interspace 494 is so flat that the second immersion liquid 434b is hindered solely by cohesive forces from discharging laterally out of the second interspace 494. The smaller the spacing between the terminating element 444 and the light-sensitive layer 26, the better do the cohesive forces hold the second immersion liquid 434b in the second interspace 494.

In order to reduce the requirements as regards the parallelism of the terminating element 444 relative to the image plane 28, a material having a refractive index that is as equal as possible to the refractive index of the surrounding immersion liquids 434a, 434b can be chosen for the terminating element 444. In the case where use is made of water by way of immersion liquid, LiF, which is still highly transparent at least at a wavelength of 193 nm, is suitable, for example, by way of material for the terminating element 444. The difference in the refractive indices then amounts to only 0.0066.

If the projection light has a particularly short wavelength, for example 157 nm, the first immersion liquid 434a may also consist of a fluorinated hydrocarbon that has a higher transmission than water at these wavelengths. For the second immersion liquid 434b the somewhat lower transmission is not too disadvantageous, inasmuch as the height of the second interspace 494 will generally be very low. In addition, water has the advantage that it corrodes the light-sensitive layer 26 less severely than is the case, for instance, with fluorinated hydrocarbons.

In the fourth exemplary embodiment the projection exposure apparatus is designed for scanning operation. This means that the reticle 24 is displaced in the object plane 22 during the projection. Synchronously with this, the support 30 with the light-sensitive layer 26 applied thereon is also displaced parallel to the image plane 28. The lateral magnification of the projection lens 420 determines the ratio of the displacement speeds and the displacement directions of the reticle 24 and of the support 30.

Figure 5:
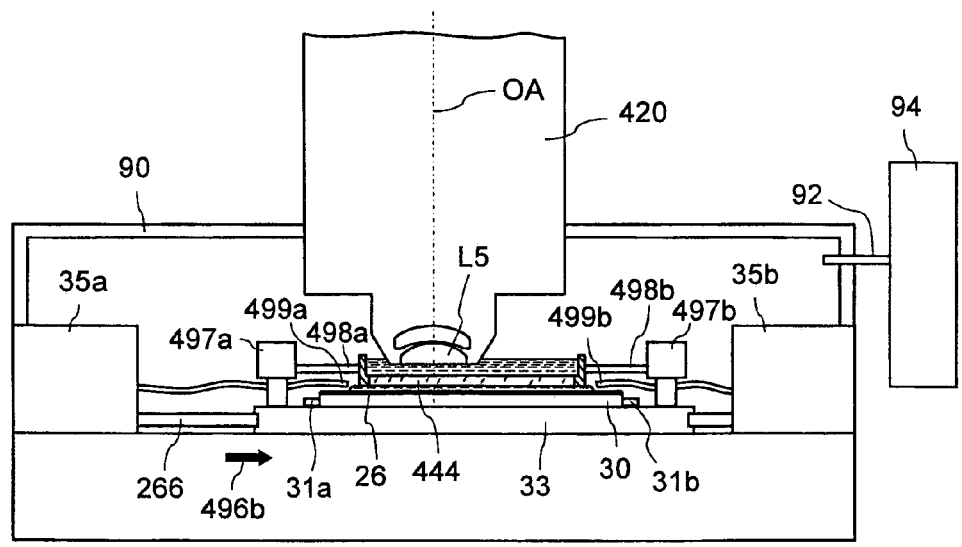
FIG. 5 a projection exposure apparatus with a displaced terminating element according to a fourth exemplary embodiment of the invention in a detail representation corresponding to FIG. 1.

For this purpose, the support 30 is clamped, with the aid of clamping elements 31a, 31b which are discernible in FIG. 5, on a displaceable table 33 which is ordinarily designated as a wafer stage. The table 33 can be displaced with great accuracy parallel to the image plane 28 in a manner known as such with the aid of actuating drives. The actuating drives are represented in simplified manner in FIG. 5 and are denoted by 35a and 35b.

Manipulators 497a, 497b are fastened to the table 33, so that said manipulators jointly execute displacement movements of the table 33. The manipulators 497a, 497b are connected to the tank 488 via actuating arms 498a, 498b. The manipulators 497a, 497b are constructed in such a way that they are able to move the tank 488 parallel to the image plane 28 and relative to the table 33, to displace it perpendicular thereto, i.e. parallel to an axis OA, and also to tilt it relative to the image plane 28. In the exemplary embodiment that is represented, tilting movements in particular are possible about two horizontal axes which extend perpendicular to directions of motion of the table 33 and perpendicular to the optical axis OA.

Furthermore, in FIG. 5 optional gas-discharge nozzles 499a, 499b are discernible, with which a stream of gas can be directed onto a peripheral gap which is formed between the edge 490 of the tank 488 and the light-sensitive layer 26.

The projection exposure apparatus show in FIGS. 5 and 6 operates as follows:

During a scanning operation the table 33 is displaced together with the manipulators 497a, 497b in the direction of the arrow 496b (see FIG. 6) with the aid of the actuating drives 35a, 35b. The manipulators 497a, 497b execute no actuating movements during this process, so that the tank 488 with the terminating element 444 sunk therein moves synchronously and at the same displacement speed and in the same displacement direction with the table 33 and consequently also with the light-sensitive layer 26. In FIG. 6 this is indicated by an arrow 496a which has the same direction and length as the arrow 496b. The tank 488 consequently moves away beneath the projection lens 420 during the scanning operation together with the light-sensitive layer 26.

Figure 6:
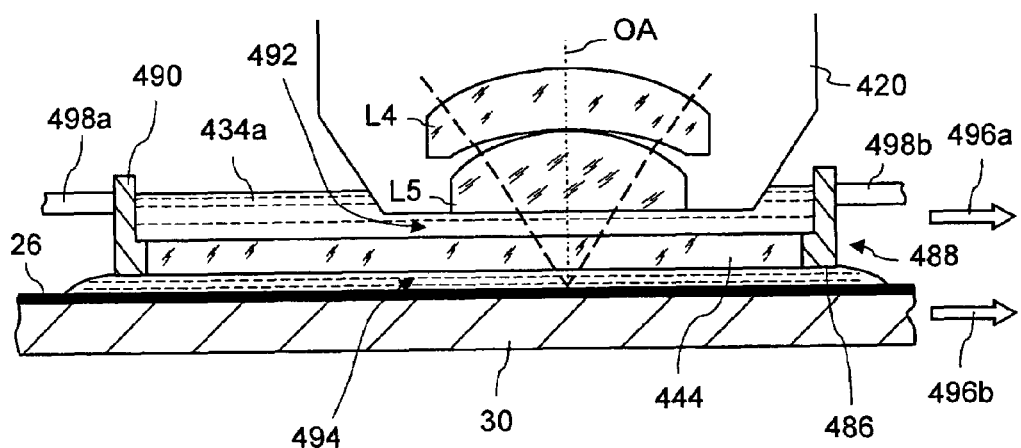
FIG. 6 an enlarged detail from the image-side end of the projection lens which is an integral part of the projection exposure apparatus shown in FIG. 5, in a first displaced position of the support and of the terminating element.
Figure 7:
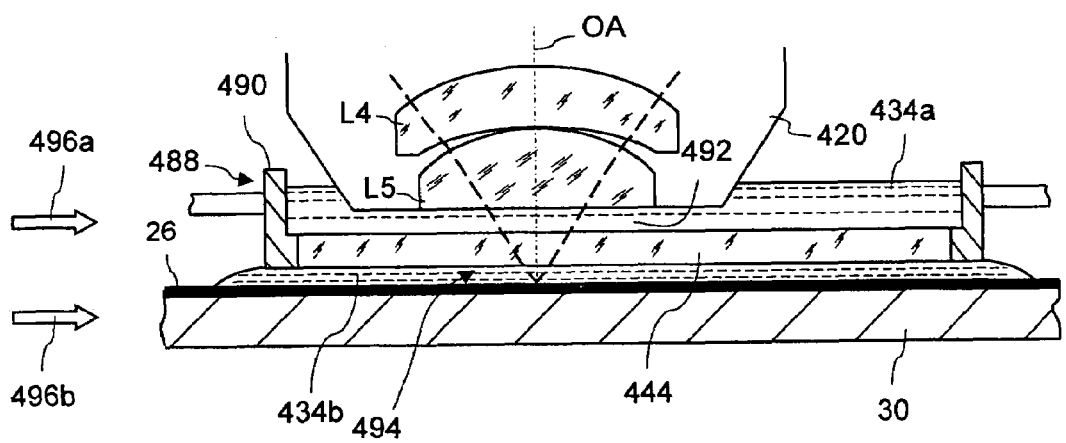
FIG. 7 the image-side end of the projection lens from FIG. 6 in a second displaced position of the support and of the terminating element.

FIG. 7 shows, in a detail corresponding to FIG. 6, the relative position of the tank 488 and of the light-sensitive layer 26, on the one hand, and of the projection lens 420, on the other hand, at the end of the scanning operation. Since the tank 488 moves synchronously, in parallel and at the same displacement speed as the light-sensitive layer 26 during the scanning operation, no shear forces act on the second immersion liquid 434b in the second interspace 494. The second immersion liquid 434b therefore remains in the second interspace 494 also during the displacement movements of the support 30. An incident flow on the second immersion liquid 434b with gases emerging from the discharge nozzles 499a, 499b may therefore be reduced or may even become superfluous. Hence one of the significant causes of the formation of bubbles in the second immersion liquid 434b ceases to apply, either entirely or partially.

Since the first immersion liquid 434a remains in the tank 488 solely by reason of the force of gravity, here too no incident flow with gases is required in order to prevent an escape of the immersion liquid during the scanning operation. Bubbles are also unable to arise to an appreciable extent as a result of the intermixing which the fixed projection lens 420 brings about in the first immersion liquid 434a passing by. Such an intermixing is entirely desirable, since in this way the formation of relatively large temperature gradients is counteracted.

Overall it is possible for considerably diminished numbers of rejects to be achieved in this way, since neither in the first immersion liquid 434a nor in the second immersion liquid 434b can bubbles arise to an appreciable extent as a consequence of the displacement movements during a scanning operation.

Between consecutive exposure cycles it is frequently necessary to reposition the support 30, with the light-sensitive layer 26 applied thereon, with respect to the projection lens 420. The displacement speeds in the course of these positioning movements are generally distinctly higher than in the course of the movements during exposure.

If the tank 488 is exactly the same size as the light-sensitive layer 26 applied on the support 30, during positioning movements of such a type the tank 488 can be displaced just as synchronously and at the same speed as has been described above in connection with the scanning operations. In general, however, for various reasons it will be expedient if the tank 488 has smaller dimensions parallel to the image plane 28 than the light-sensitive layer 26 applied on the support 30. For example, the smaller the tank 488, the smaller also is the interface of the first immersion liquid 434a to a surrounding gas. Accordingly, less heat of evaporation is also withdrawn from the first immersion liquid 434a. This in turn has a favorable effect on a homogeneous distribution of temperature, and hence of refractive index, within the first immersion liquid 434a. From this point of view it would be ideal if the tank 488 is only slightly larger than the region on the light-sensitive layer 26 that is exposed overall during a scanning operation.

For larger positioning movements, however, a smaller tank 488 means that the tank 488 cannot jointly execute this movement, at least not fully. In this case a relative movement between the light-sensitive layer 26 and the terminating element 444 is unavoidable. This relative movement is generated by the manipulators 497a, 497b which are fastened to the table 33.

In order to prevent formation of bubbles in the second immersion liquid 434b also during a faster positioning movement of the support 30, in the fourth exemplary embodiment represented in FIGS. 5 to 7 the entire tank 488 can be additionally tilted with the aid of the manipulators.

Figure 8:
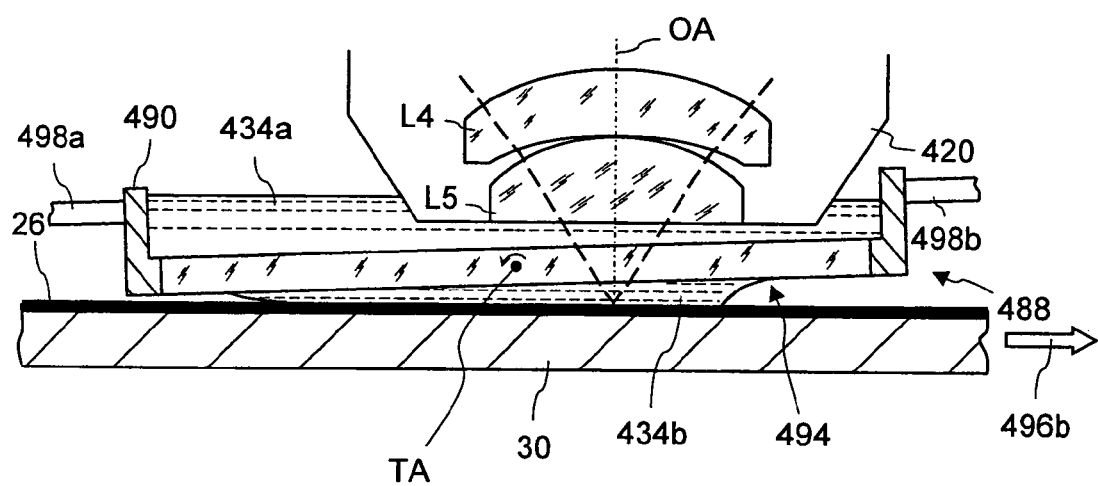
FIG. 8 the image-side end of the projection lens from FIG. 6 with tilted terminating element.

In FIG. 8 the image-side end of the projection lens 420 is shown in a representation based upon FIGS. 6 and 7, the tank 488 having been tilted by 2°. The tilt axis, which is denoted in FIG. 8 by TA, extends perpendicular both to the optical axis OA and to the direction of motion 496b of the support 30. By virtue of the tilting movement of the tank 488 about the axis TA, the second interspace 494, which has a constant height during a scanning operation, is given the shape of a wedge-like prism. In the tilted position of the tank 488 the end of the tank 488 situated at the rear in the direction of motion 496b is removed just so far from the light-sensitive layer 26 that damage thereto is avoided. The cohesive forces now acting more strongly prevent, even at higher positioning speeds, the second immersion liquid 434b from emerging from the second interspace 494, whereas the support 30 moves away in the direction of the arrow 496b beneath the fixed or at worst slowly moving tank 488.

If during the scanning operations the spacing between the light-sensitive layer 26 and the terminating element 444 is so small that a tilting movement about the tilt axis TA could involve damage to the layer 26, alternatively a tilt axis may be chosen that extends through the end of the tank 488 situated at the rear in the direction of motion 496b. For the manipulators 497a, 497b this means that the manipulator 497b raises the side of the tank 488 situated at the front in the direction of motion by the requisite distance.

In order in the third exemplary embodiment shown in FIGS. 5 to 8 to prevent undesirable losses of heat of the first immersion liquid 434a and of the second immersion liquid 434b, the projection exposure apparatus exhibits a container 90 which tightly seals the space surrounding the immersion liquids 434a, 434b outwardly. Via an inlet 92, water vapor which is generated by an evaporator 94 can be introduced into the space surrounded by the container 90. The water vapor is introduced until such time as the saturation vapor pressure applying at the existing temperature is attained, at least approximately, within the space surrounded by the container 90. In this way the immersion liquids, which here each consist of water, are prevented from gradually evaporating, which would result in a cooling of the liquid at the interfaces to the surrounding atmosphere. It will be understood that in the event of a change-over to other immersion liquids other liquids also have to be evaporated correspondingly in the evaporator 94.

A fifth exemplary embodiment will be described in the following on the basis of FIGS. 9 and 10, which show schematically a detail from the image-side end of a projection lens and an enlarged detailed representation D thereof, respectively. Parts similar to those in FIGS. 1 to 4 are denoted by identical reference numerals; parts that have counterparts in the fourth exemplary embodiment bear reference numerals augmented by 100.

In the fifth exemplary embodiment, in contrast with the third exemplary embodiment shown in FIGS. 5 to 8, an additional cover plate 500 is provided which almost totally covers the tank 588 in the upward direction. The covet plate 500, which does not have to be transparent, exhibits an opening 502, through which the image-side end of the projection lens 520 is immersed in the first immersion liquid 534a. The edge 590 of the tank 588 slides along the underside of the cover plate 500 in the course of a displacement movement of the tank 588 indicated by an arrow 596a.

The space between the cover plate 500 and the tank 588 is filled out completely with the first immersion liquid 534a. For this purpose the opening 502 is so dimensioned that a peripheral gap 504 remains around the image-side end of the projection lens 520, in which a liquid level can be adjusted.

Figure 10:
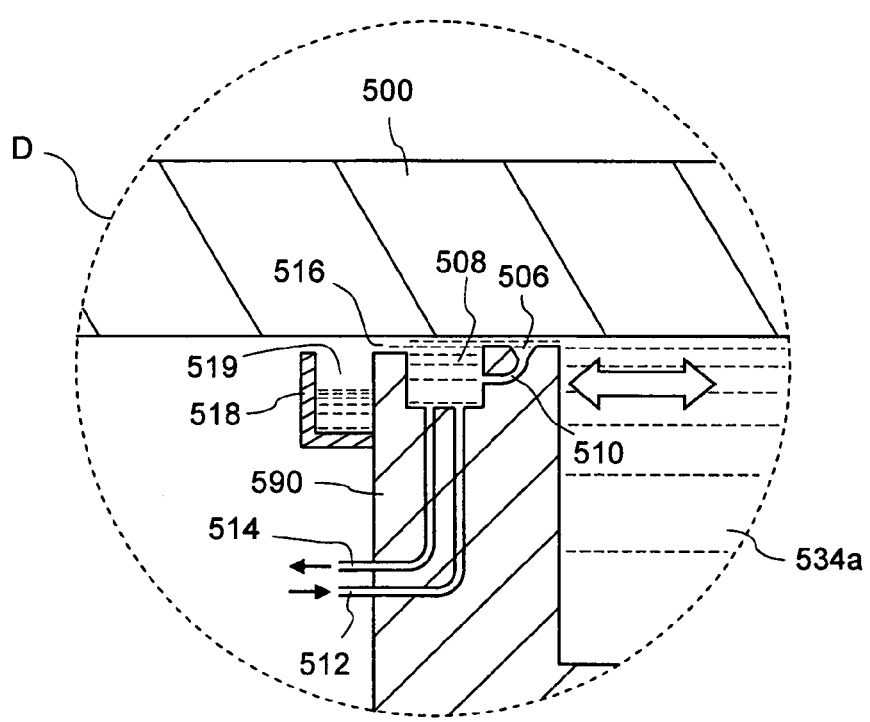
FIG. 10 a further enlarged detail D from FIG. 9, in which the transition between the cover and an edge of a tank receiving the first immersion liquid is shown.

FIG. 10 shows an enlarged detail D from the region of the edge 590. In the detail D it can be discerned that the edge 590 of the tank 588 is provided on its upward-pointing lateral face with a peripheral wedge-shaped groove 506 and with a likewise peripheral rectangular groove of larger cross-section, which constitutes a reservoir 508 for the immersion liquid 534a. The reservoir 508 and the wedge-shaped groove 506, which is connected to the reservoir 508 via a duct 510, are always filled with the first immersion liquid 534a, so that a thin liquid film is formed on the upward-pointing lateral face of the edge 590. This liquid film acts as a lubrication and in this way enables low-friction and vibration-free sliding of the tank 588 along the underside of the cover plate 500.

In order to ensure that the liquid film does not break away in the course of a movement of the tank 588 away beneath the cover plate 500, with gas bubbles thereby being introduced into the first immersion liquid 534a, the first immersion liquid 534a in the reservoir 508 and in the wedge-shaped groove 506 is under a slight overpressure. This overpressure is generated by first immersion liquid 534a being constantly supplied under pressure to the reservoir 508 via a supply line 512. At the same time, excess first immersion liquid 534a is able to flow away via a drainage line 514. If the contact pressure generated by the dead weight of the cover plate 500 does not suffice by way of counterpressure, the cover plate 500 can be additionally loaded, for example with the aid of springs.

For the case where first immersion liquid 534a emerges through a somewhat wider gap 516 on the outside of the edge 590, a peripheral overflow channel 518 is provided which collects emergent first immersion liquid 534a and conducts it away in a manner not represented in any detail. A protective gas 519 that is heavier than air and that, for example, may have the property of having only very low solubility in respect of the first immersion liquid 534a may be charged into the overflow channel 518. As a result, molecules from a gas surrounding the entire arrangement, which impair the optical properties of the first immersion liquid 534a in undesirable manner, are prevented from going into solution. The protective gas 519 in the overflow channel 518 is may be renewed continuously, in order to counteract a gradual intermixing with the surrounding gas.

The seal in the region of the edge 590 is of importance to the extent that the support 30 of the light-sensitive layer 26 is not only frequently displaced in a plane parallel to the image plane 28 but, with a view to diminishing imaging errors, can also be tilted slightly about a horizontal axis. If the cover plate 500 is then not to be tilted together with it, the seal in the direction towards the edge 590 must be so constructed that it guarantees sufficient imperviousness in relation to the cover plate 500 even in the case of relatively small tilting movements of the tank 588.

If the case may arise that the lubrication by the first immersion liquid 534a is not sufficient for a short time, for the cover plate 500 and the edge 590 it is advisable to choose materials or coatings of these parts that minimize or even entirely avoid a contamination of the first immersion liquid 534a as a consequence of abrasion in the course of start-up. Aluminum oxide or diamond, for example, enter into consideration here as coatings.

The cover plate 500 has, on the one hand, the advantage that the occurrence of waves in the tank 588 is prevented. On the other hand, the cover plate 500 limits the interface of the first immersion liquid 534a relative to a surrounding atmosphere to the narrow peripheral gap 504 which remains between the image-side end of the projection lens 520 and the cover plate 500. In this way only very little heat is withdrawn from the first immersion liquid 534a as a consequence of evaporation. This in turn diminishes the temperature gradient and hence the refractive-index gradient within the first immersion liquid 534a, which is formed in the course of heating by the projection light 13. In the case of the second immersion liquid 534b the problem of evaporation does not exist to an appreciable extent, inasmuch as the interface between the second immersion liquid 534b and a surrounding atmosphere is in any case very small.

In order to introduce the immersion liquids 534a, 534b into the first and second interspaces 592 and 594, respectively, a relatively small amount of the second immersion liquid 534b may firstly applied onto the light-sensitive layer 26. Subsequently the underside of the tank 588 is mounted on one side or parallel, and the second immersion liquid 534b is expressed in bubble-free manner. The spacing between the tank 588 and the light-sensitive layer 26 can later be adjusted precisely with the aid of the manipulators 497a, 497b.

Subsequently the cover plate 500 is laid over the tank 588. In order to fill the tank 588 with the first immersion liquid 534a, the latter may, for example, be charged via the peripheral gap 504 which remains between the projection lens 520 and the cover plate 500. However, it will be easier if the edge 590 of the tank 588 is provided with an inlet and with an outlet, via which the first immersion liquid 534a can be charged into the tank 588 and removed therefrom. During operation of the projection exposure apparatus the first immersion liquid 534a may also be circulated continuously in a circuit, as elucidated in connection with the first three exemplary embodiments.

Figure 9:
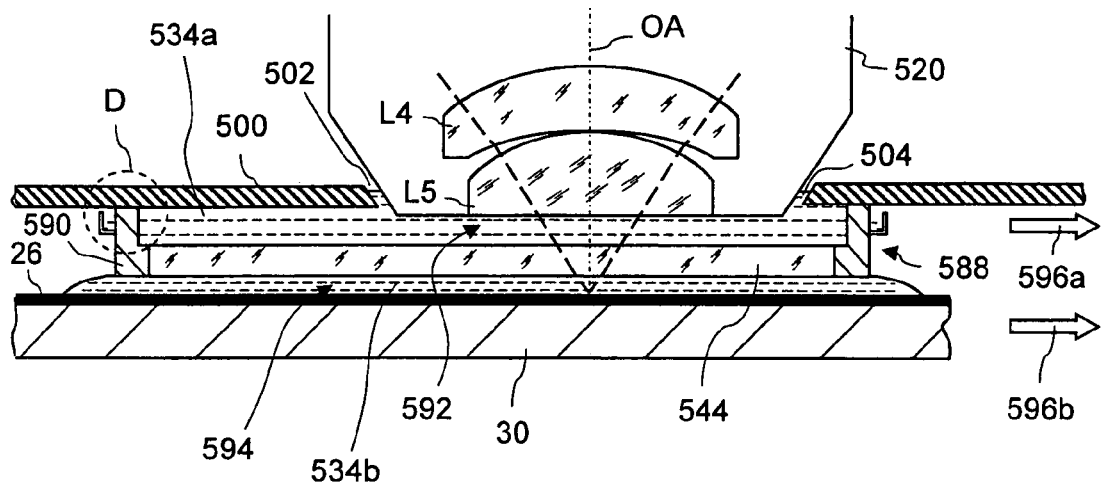
FIG. 9 an enlarged detail from the image-side end of a projection lens according to a fifth exemplary embodiment of the invention, wherein an additional cover covers the first interspace.

Of course, the arrangement shown in FIGS. 9 and 10 may likewise be accommodated in a container 90, as shown in FIG. 5 with reference to the fourth exemplary embodiment. In this way the evaporation of the immersion liquids is further reduced.

FIGS. 11 to 16 each show, in schematic representations based upon FIG. 2, the image-side end of projection lenses according to further exemplary embodiments of the invention. In these Figures, for parts similar to those in FIG. 2 use is made of the same reference numerals, and for parts corresponding to one another use is made of reference numerals that are augmented by 600, 700, 800, 900, 1000 and 1100, respectively.

Figure 11:
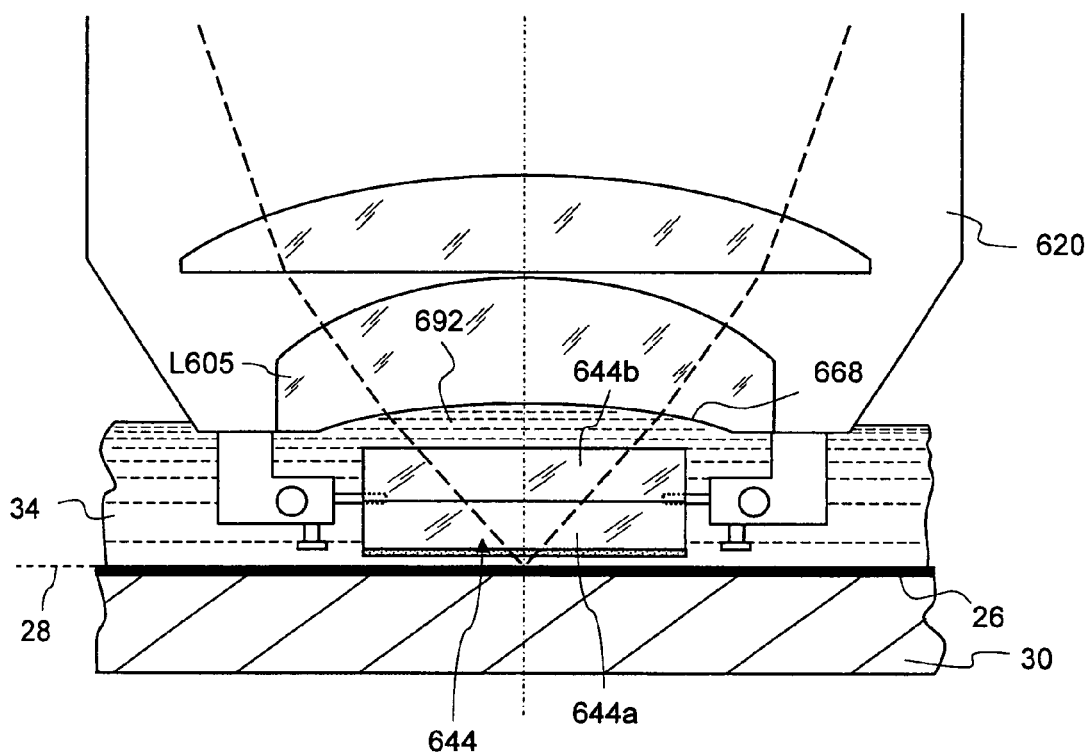
FIG. 11 the image-side end of a projection lens according to a sixth exemplary embodiment of the invention, wherein the image-side face of the final optical element on the image side is curved.

In the sixth exemplary embodiment shown in FIG. 11 the image-side boundary surface 668 of the final lens L605 on the image side is not flat but curved in aspherically concave manner. For it has been shown that, in the case of immersion objectives in particular, an aspherically curved face in the immediate vicinity of the image plane 28 is particularly well suited for the correction of higher-order imaging errors. The prerequisite for this, however, is that the refractive indices of the final lens L605 on the image side and of the immersion liquid 34 differ sufficiently from one another.

In the case of the projection lens 620 the terminating element 644 also comprises two members 644a, 644b which are fabricated from calcium-fluoride crystals or from similar cubically crystalline crystals with suitably chosen crystal orientations. In the exemplary embodiment that is represented, the final lens L605 on the image side consists of quartz glass. As an alternative to this, the final lens L605 on the image side may likewise consist of a cubically crystalline material. The crystal orientations of the crystals that the final lens L605 on the image side and the members 644a, 644b consist of may then likewise be so aligned that a very extensive correction of the intrinsic birefringence is achieved. The way in which a reciprocal birefringence compensation can be achieved with three crystal orientations rotated relative to one another about the optical axis is described in detail in the printed publications WO 02/093209 A2, WO 2/099450 A2 and U.S. 2003/0011896 A1 already mentioned above.

Figure 12:
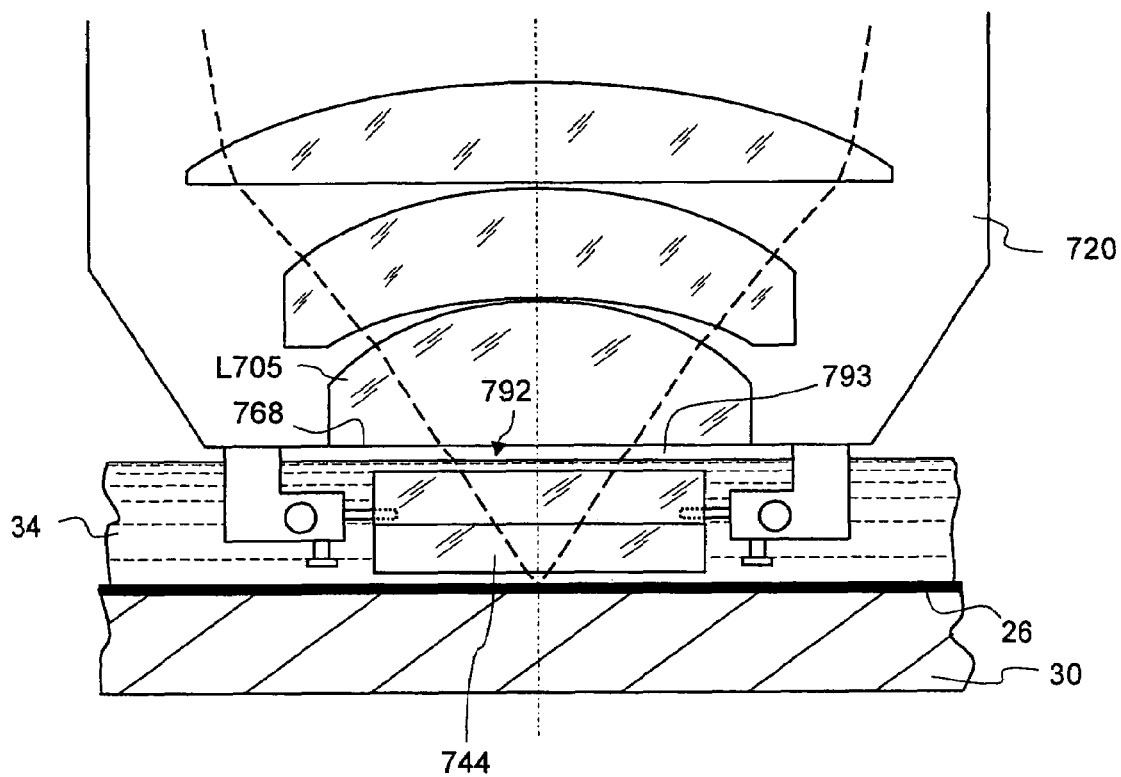
FIG. 12 the image-side end of a projection lens according to a seventh exemplary embodiment of the invention, wherein a gas-filled interspace remains between the final optical element on the image side and the immersion liquid.

In the seventh exemplary embodiment represented in FIG. 12 the first interspace 792 remaining between the final lens L705 on the image side and the terminating element 744 is not filled with immersion liquid 34 completely but only partially. Therefore a gap-like interspace 793 filled with a surrounding gas remains between the final lens L705 on the image side and the immersion liquid 34.

This variant is particularly advantageous in the case of projection lenses that are provided both for dry operation and for immersion mode. In order to have to perform as few modifications as possible to the projection lens in the event of a change from dry operation to immersion mode, and vice versa, the optical conditions should change at as few boundary surfaces as possible. In the case of the projection lens 720, for this reason the image-side face 768 of the final lens L705 on the image side still adjoins a surrounding gas and not, for instance, immersion liquid 34.

On the other hand, also in the case of the projection lens 720 it is guaranteed that the terminating element 744 is surrounded by the immersion liquid 34 on both sides. On account of the lower refractive-index quotient at the boundary surfaces of the terminating element 744, positional tolerances and manufacturing tolerances of the terminating element 744 may consequently only have a slight effect on the imaging properties of the projection lens 720.

Figure 13:
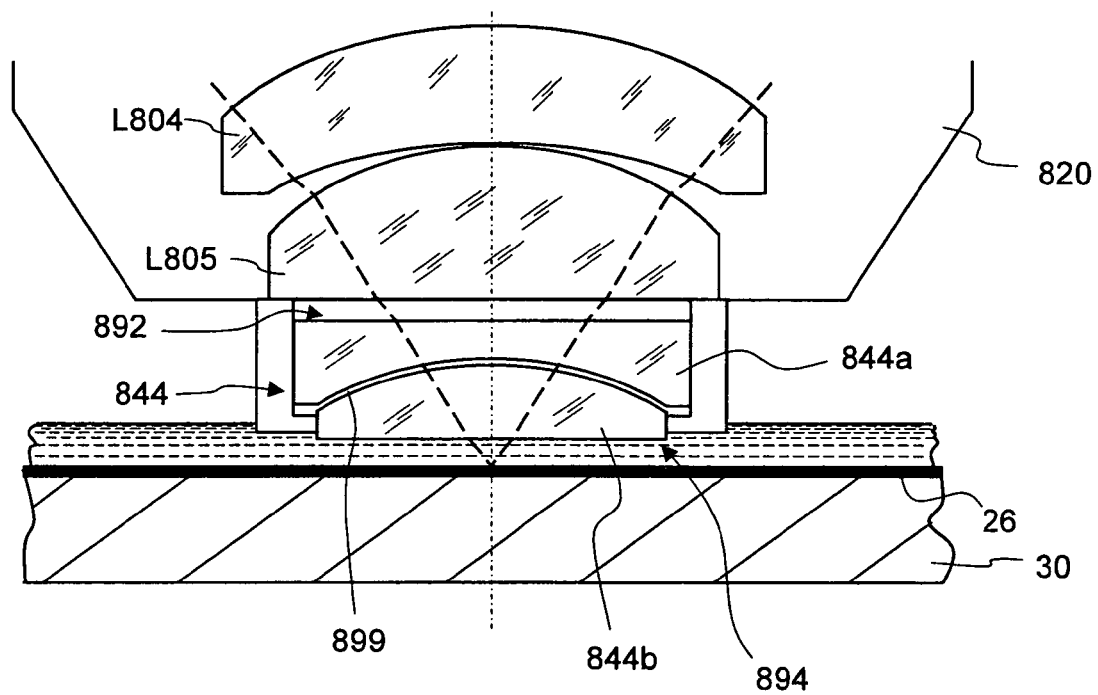
FIG. 13 the image-side end of a projection lens according to an eighth exemplary embodiment of the invention, wherein the terminating element is divided up into two members along a curved face.

In the eighth exemplary embodiment shown in FIG. 13 the terminating element 844, which is plane-parallel overall, likewise comprises two members 844a, 844b which may consist of cubically crystalline materials with differing crystal orientations. In contrast with the exemplary embodiments described above, the boundary surface between the two members 844a, 844b in the case of the projection lens 820 is not flat but curved. Furthermore, the two members 844a, 844b are not optically contacted with one another directly but are spaced from one another, so that a narrow gap 899 remains between the members 844a, 844b, which in the case of the projection lens 820 is filled with a surrounding gas.

In the case of the projection lens 820 only the image-side partial element 844b comes into contact with the immersion liquid 34. Therefore it will generally be sufficient to exchange only the partial element 844b when required. The object-side partial element 844a, on the other hand, may be mounted on or in the projection lens 820 in such a manner that an exchange can only be carried out with major effort. Consequently only the partial element 844b constitutes an exchange element in the real sense of the word.

The partitioning of the terminating element 844 into two members 844a, 844b along a curved parting surface has the advantage that the image-side partial element 844b is likewise relatively insensitive to manufacturing tolerances and positional tolerances. For, on the one hand, the image-side face is immersed in immersion liquid 34, so that the refractive-index quotient there is small. On the other hand, on the object-side face of the partial element 844b only relatively small entrance angles arise by reason of the convex curvature thereof in the case of light beams that pass through the terminating element 844 at large angles relative to the optical axis, so that manufacturing tolerances and positional tolerances are able to have less effect there.

Figure 14:
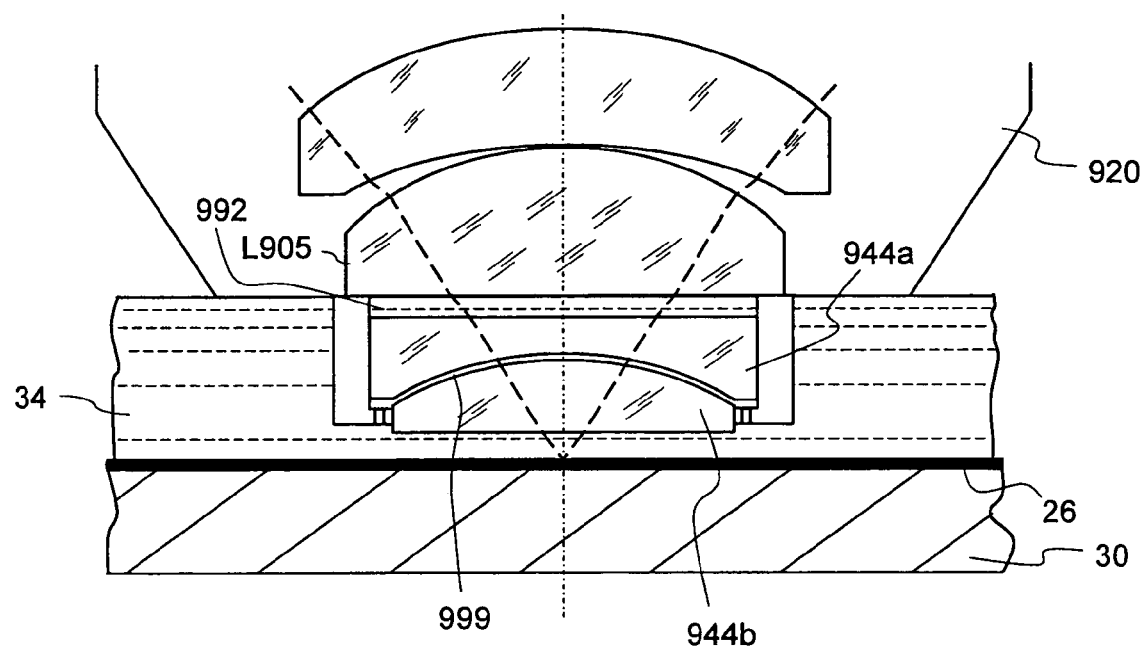
FIG. 14 the image-side end of a projection lens according to a ninth exemplary embodiment of the invention with terminating element divided up in curved manner, which is completely received in immersion liquid.

The projection lens 920 shown in FIG. 14 according to a ninth exemplary embodiment differs from the projection lens 820 merely by virtue of the fact that the immersion liquid 34 comes directly up against the final lens L905 on the image side. Therefore, unlike in the case of the projection lens 820 shown in FIG. 13, both the gap 999 remaining between the two members 944a, 944b and the first interspace 992 between the final lens L905 on the image side and the terminating element 944 are filled up with immersion liquid 34. Positional tolerances and manufacturing tolerances of the terminating element 944 have even less effect on the imaging properties of the projection lens in this variant.

Since, although the object-side partial element 944a is exposed to the immersion liquid 34, it is relatively well protected by the final lens L905 on the image side or by the image-side partial element 944b, also in the case of the projection lens 920 an exchange of optical elements on account of contamination may be restricted to the image-side partial element 944b. However, the immersion liquid 34 reaching as far as the final lens L905 on the image side necessitates more extensive modifications if a change-over from dry operation to immersion mode is desired.

Figure 15:
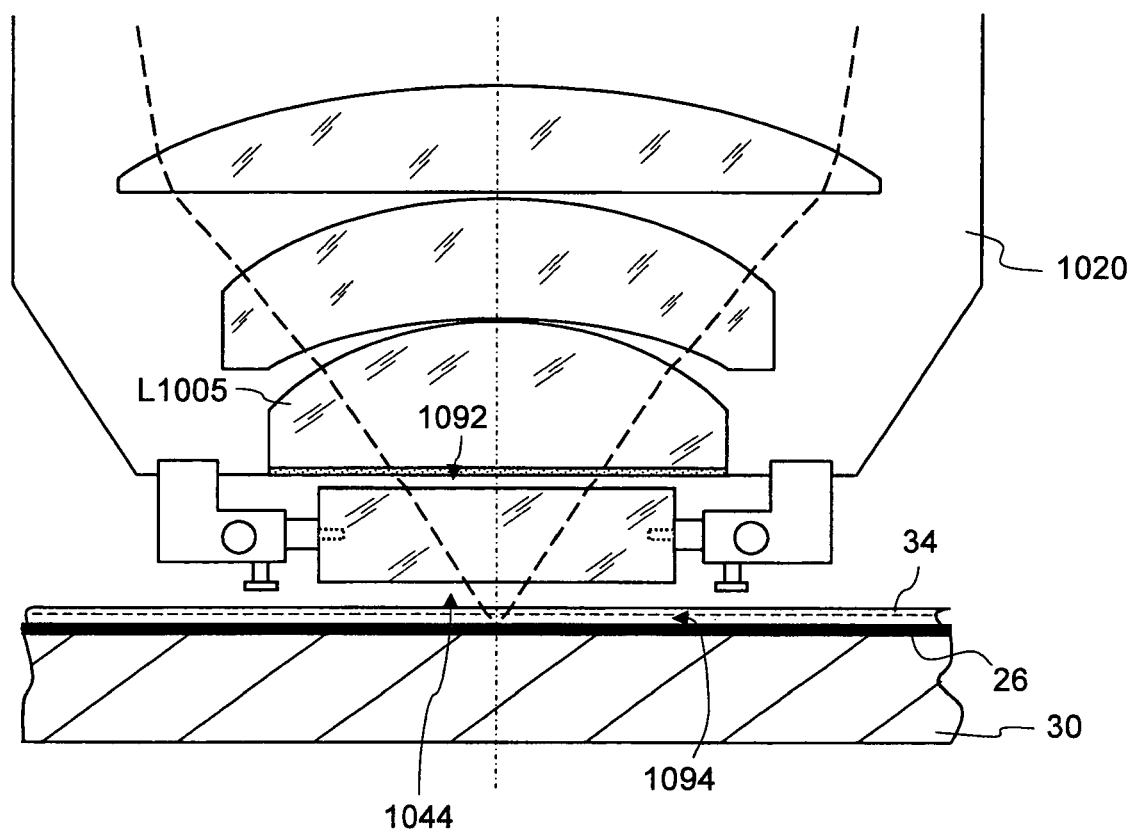
FIG. 15 the image-side end of a projection lens according to a tenth exemplary embodiment of the invention, wherein a gas-filled interspace remains between the terminating element and the immersion liquid.

FIG. 15 shows an image-side end of a projection lens 1020 according to a tenth exemplary embodiment of the invention. Unlike in the case of the exemplary embodiments described previously, the terminating element 1044 is not immersed in the immersion liquid 34. The faces of the terminating element 1044 that are permeated by projection light consequently adjoin a surrounding gas both on the object side and on the image side. This arrangement is also advantageous, in particular, in the case of projection lenses that are to be suitable both for dry operation and for immersion mode. This is because the arrangement shown in FIG. 15 requires particularly few modifications in the event of a change-over between the operating modes. On the other hand, the optical conditions at the two boundary surfaces of the terminating element 1044 are largely identical. This is advantageous to the extent that, in particular, imaging errors that are generated by positional tolerances, for example tilting movements, at the object-side boundary surface, are compensated really well by imaging errors acting in the opposite sense on the image-side boundary surface.

Figure 16:
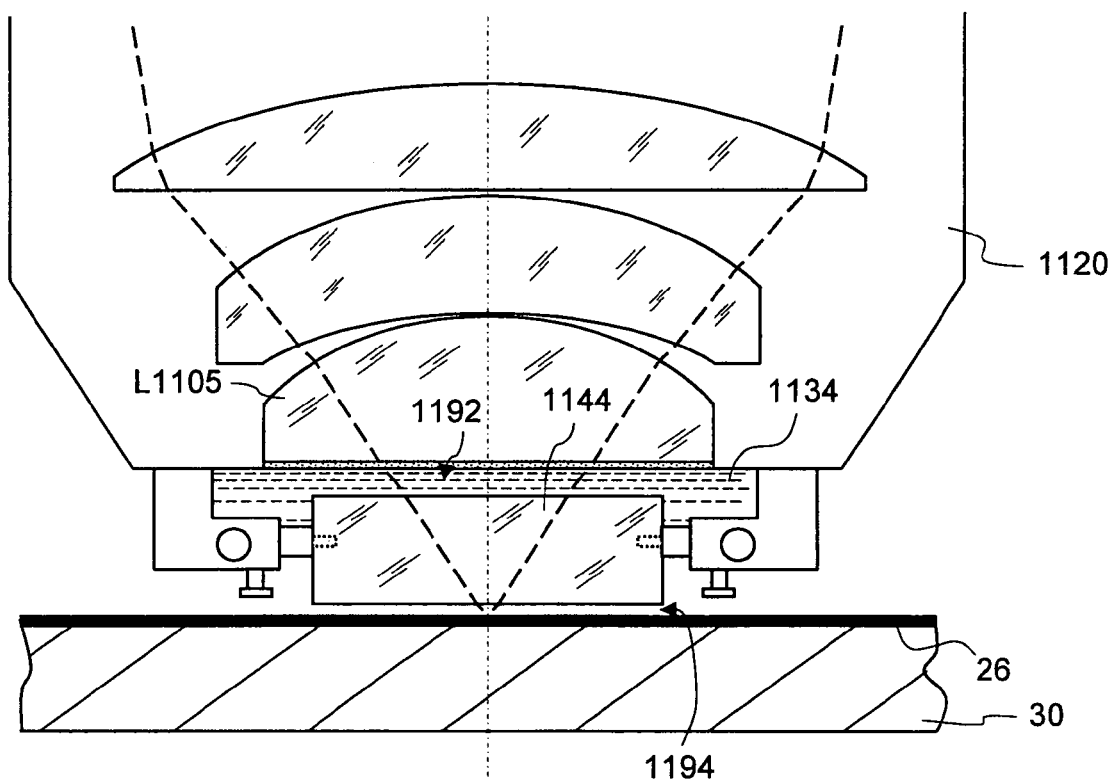
FIG. 16 the image-side end of the projection lens shown in FIG. 15, but with an immersion liquid filling the interspace between the final optical element on the image side and the terminating element.

The projection lens 1120 shown in FIG. 16 differs from the projection lens 1020 shown in FIG. 15 by virtue of the fact that the first interspace 1192 between the final lens L1105 on the image side and the terminating element 1144 is filled out not with a surrounding gas but with a liquid 1134. The image-side face of the terminating element 1114 is therefore comparatively insensitive to manufacturing tolerances, in particular fitting errors, of the terminating element 1144.

The second interspace 1194 between the terminating element 1144 and the light-sensitive layer 26 can be filled up either partially with immersion liquid 34, as is the case with the projection lens 1020 shown in FIG. 15. During dry operation, as shown by FIG. 16, the light-sensitive layer 26 is not covered by immersion liquid.

Figure 17:
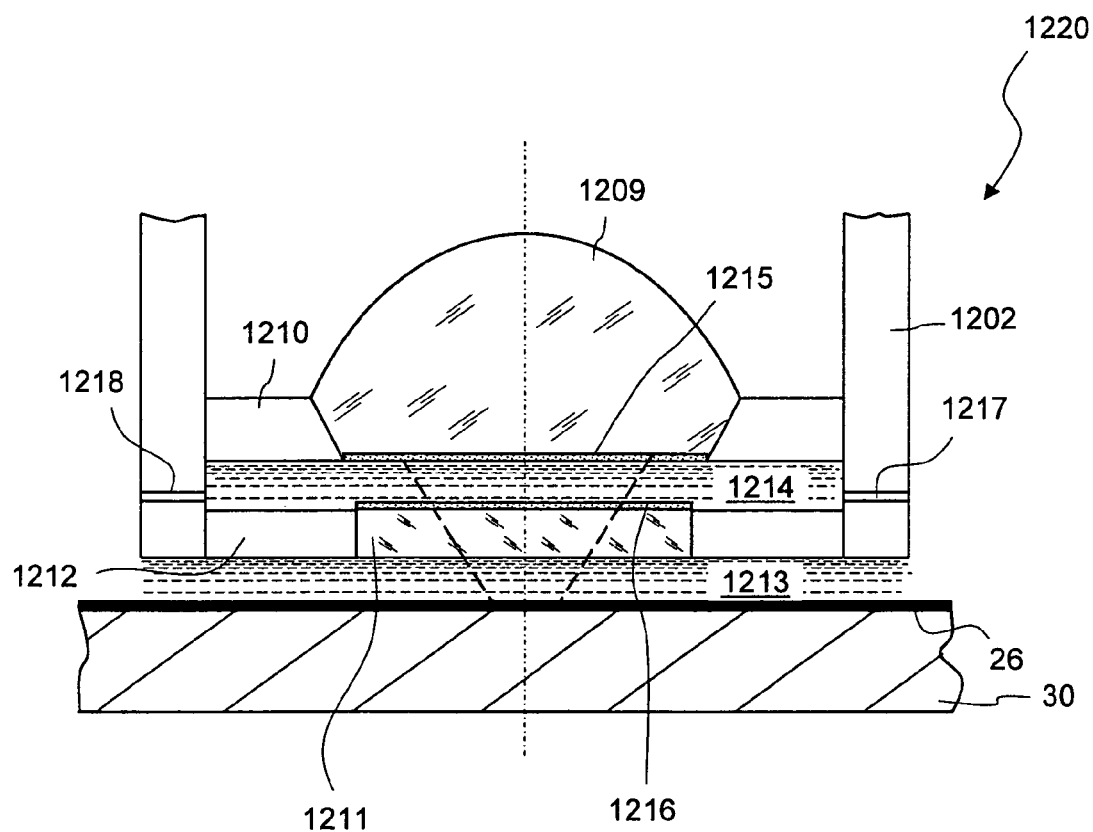
FIG. 17 the image-side end of a projection lens according to an eleventh exemplary embodiment of the invention, in which, similar to the embodiment shown in FIG. 4, the terminating element is completely immersion in two different immersion liquids.

FIG. 17 shows an image-side end of a projection lens 1220 according to an eleventh exemplary embodiment of the invention. A final lens 1209 is received in a lens mount 1210, which is connected to a housing 1202 of the projection lens 1220 such that it may not easily be replaced by another lens. However, the lens mount 1210 may also be configured such that the final lens 1209 can be easily exchanged. The final lens 1209 may be made of $CaF_2$, however, other lens materials such as $SiO_2$ are contemplated as well.

The projection lens 1220 further comprises a terminating element 1211 which may be made, for example, of amorphous quartz ($SiO_2$), $CaF_2$ or another material having a high transmission at the wavelength used. The terminating element 1211 is received in an element mount 1212 which is connected to the housing 1202 of the projection lens 1220. The terminating element 1211 is received in the element mount 1212 such that it may easily be exchanged. Exchanging the terminating element 1211 may be advantageous if it suffers from degradation caused by an immersion medium 1213 during the exposure operation so that its optical properties deteriorate. In order to facilitate an exchange of the terminating element 1211, it may be optically contacted to the element mount 1212, or it may be fixed to the element mount 1212 using a solder or a glue.

In the embodiment shown the terminating element 1211 is a plane-parallel plate. However, it is also envisaged to use a very thin plate or a membrane instead. Such a thin plate or a membrane has no significant optical contribution, but effectively protects the final lens 1209.

In the interspace between the final lens 1209 and the terminating element 1211 there is a liquid 1214 having an index of refraction which at least substantially equals the index of refraction of the immersion medium 1213. Thus the effect of a possible deformation on one side of the terminating element 1211 is compensated for by a deformation on the other side. The liquid 1214 should be selected such that it does not contaminate the final lens 1209 and the terminating element 1211. In view of this, the liquid 1214 may be an oil, for example. If the immersion medium 1213 is water, the liquid 1214 should have similar optical properties. It is also possible to use the same liquid for the liquid 1214 and the immersion medium 1213.

The final lens 1209 and the terminating element 1211 are provided with protective layers 1215 and 1216, respectively, for protection against corrosion caused by the liquid 1214. In a similar way the terminating element 1211 may be provided with a protective layer on its side facing towards the immersion medium 1213 (not shown).

For achieving a certain degree of circulation of the liquid 1214, the housing 1202 of the projection objective 1202 is provided with a supply duct 1217 and an outlet 1218 for the liquid 1214. This makes it possible to continuously rinse the interspace between the final lens 1209 and the terminating element 1211. Alternatively, the liquid 1214 may remain continuously in the housing 1202 of the immersion objective 1220. In both cases a temperature control of the liquid 1214 may be envisaged. Also for the immersion medium 1213 such a circulation and also a temperature control is envisaged. The temperature control of the liquid 1214 and/or the immersion medium 1213 makes it possible to adjust the refractive index of the liquid 1214 and/or the immersion medium 1213. Since such a temperature control has been described above with reference to the embodiment shown in FIG. 4, it will not be described here in further detail.

The distance between the terminating element 1211 from the final lens 1209 is determined such that the flow present in the immersion medium 1213 and the liquid 1214 is, at least substantially, laminar. Such an at least substantially laminar flow may be achieved by selecting the pressure of the liquid 1214 and/or the cross sections of the supply dug 1217 and/or the outlet 1218, with a given distance between the final lens 1209 and the terminating element 1211, such that an at least substantially laminar flow prevails within the liquid 1214.

Figure 18:
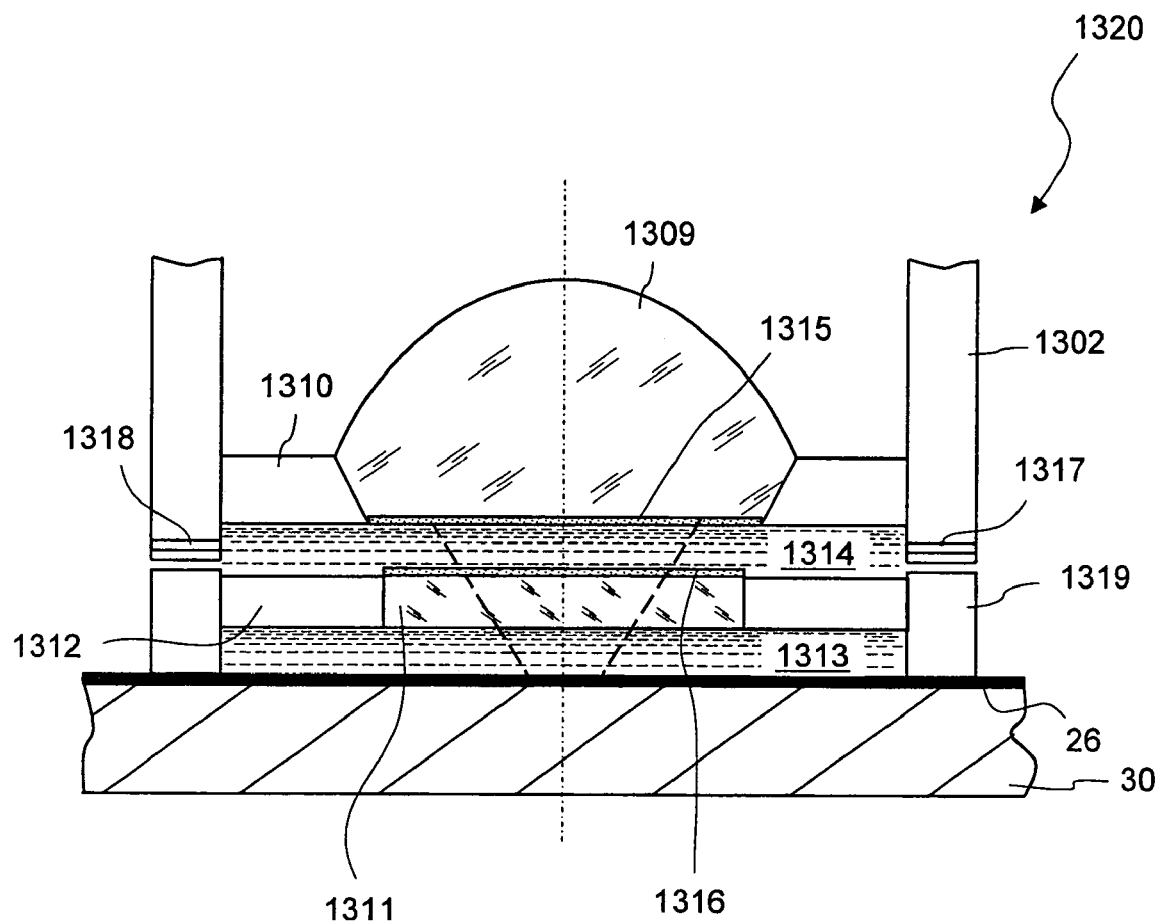
FIG. 18 the image-side end of a projection lens according to a twelfth exemplary embodiment of the invention, comprising with two completely enclosed interspaces filled with immersion liquids.

FIG. 18 shows an image-side end of a projection lens 1320 according to a twelfth exemplary embodiment of the invention. The projection lens 1320 differs from the projection lens 1220 shown in FIG. 17 in that the terminating element 1311 is connected to the housing 1302 of the projection lens 1320, whereas the terminating element 1311 is connected to a device 1319 for confining the immersion medium 1313.

Figure 19:
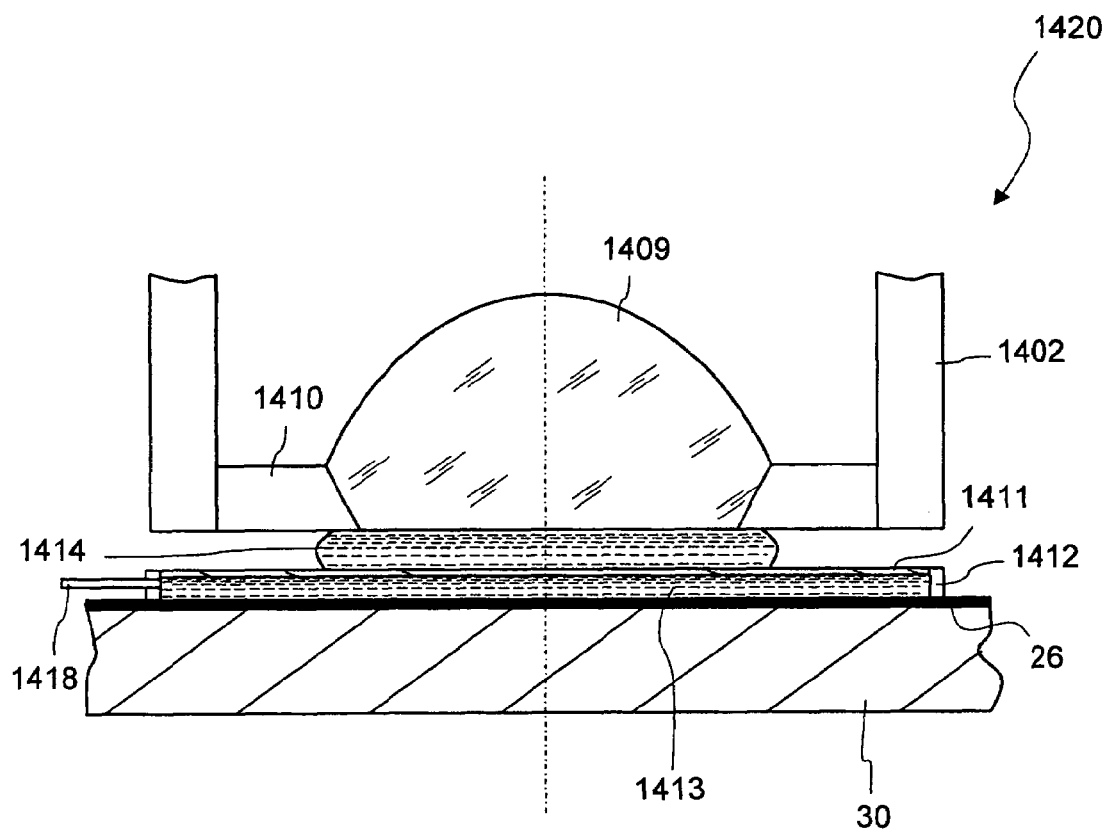
FIG. 19 the image-side end of a projection lens according to a thirteenth exemplary embodiment of the invention, wherein the terminating element is a thin plate on which an immersion liquid is held without any confinement.

FIG. 19 shows an image-side end of a projection lens 1420 according to a thirteenth exemplary embodiment of the invention. This embodiment differs from the embodiment shown in FIG. 18 mainly in that the terminating element 1411 is formed by a thin plane-parallel plate which is received in a ring-shaped element mount 1412. The terminating element 1411 may be made, in spite of the high light intensities that occur in the immediate vicinity of the light sensitive layer 26, of quartz glass. This is because the terminating element 1411 is moved together with the support 30, and therefore the high intensities are distributed in time over a large area of the terminating element 1411. This ensures that a terminating element 1411 made of quartz glass will not be damaged by high light intensities.

The immersion liquid 1413 is connected via a channel 1418 to a reservoir such that the hydrostatical pressure in the interspace between the light sensitive layer 26 and the terminating element 1411 remains constant. However, particularly if the terminating element 1411 is extremely thin, it may be advantageous to actively control the hydrostatical pressure, because this makes it possible to reduce a bending of the terminating element 1411 by adjusting the pressure in the liquid 1413. For correcting aberrations, it may also envisaged to deliberately induce a bending of the thin terminating element 1411.

Another difference to the embodiment shown in FIG. 18 is that the liquid 1414 between the final lens 1409 and the terminating element 1411 is not confined by walls or the like and does not circulate during exposure operation, but remains at its place as a result of adhesion forces. The liquid 1414 may only occasionally be exchanged.

Figure 20:
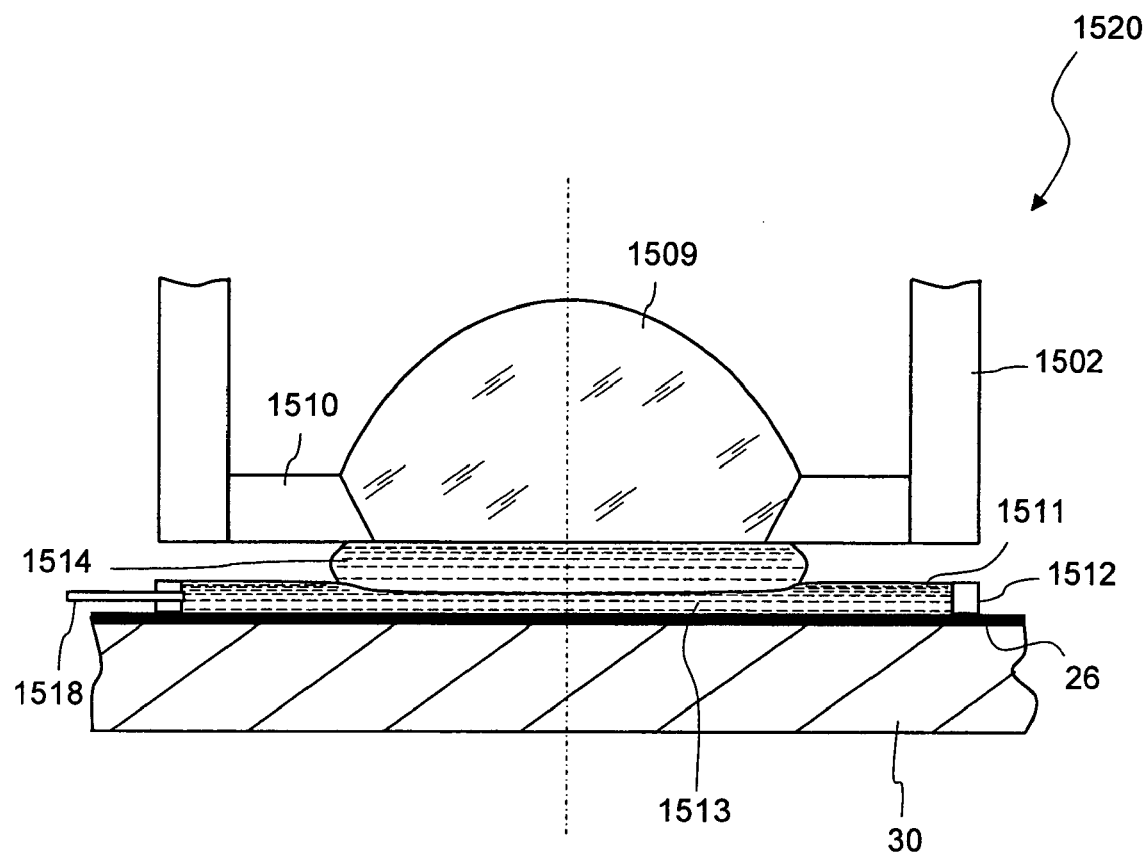
FIG. 20 the image-side end of a projection lens according to a fourteenth exemplary embodiment of the invention, wherein the terminating element is formed by a deformable membrane which is fixed to a support for the light-sensitive layer to be exposed.

FIG. 20 shows an image-side end of the projection lens 1520 according to a fourteenth exemplary embodiment of the invention. This embodiment differs from the embodiment shown in FIG. 19 mainly in that the terminating element is formed by a thin membrane 1511 instead of a thin plane-parallel plate. The membrane 1511 has elastic properties and may therefore deform during movements of the support 30. If the immersion liquid 1513 and the liquid 1514 have the same index of refraction, and if the membrane 1511 has also the same index of refraction and/or is thin enough so that its refractive properties may be neglected, deformations such as shown in FIG. 20 have no substantial adverse effect on the imaging properties of the projection objective 1520. In the same manner as a solid plate, the membrane 1511 ensures that the sensitive image-side surface of the final lens 1509 cannot be corroded by contacts with contaminated immersion liquid 1513.

Figure 21:
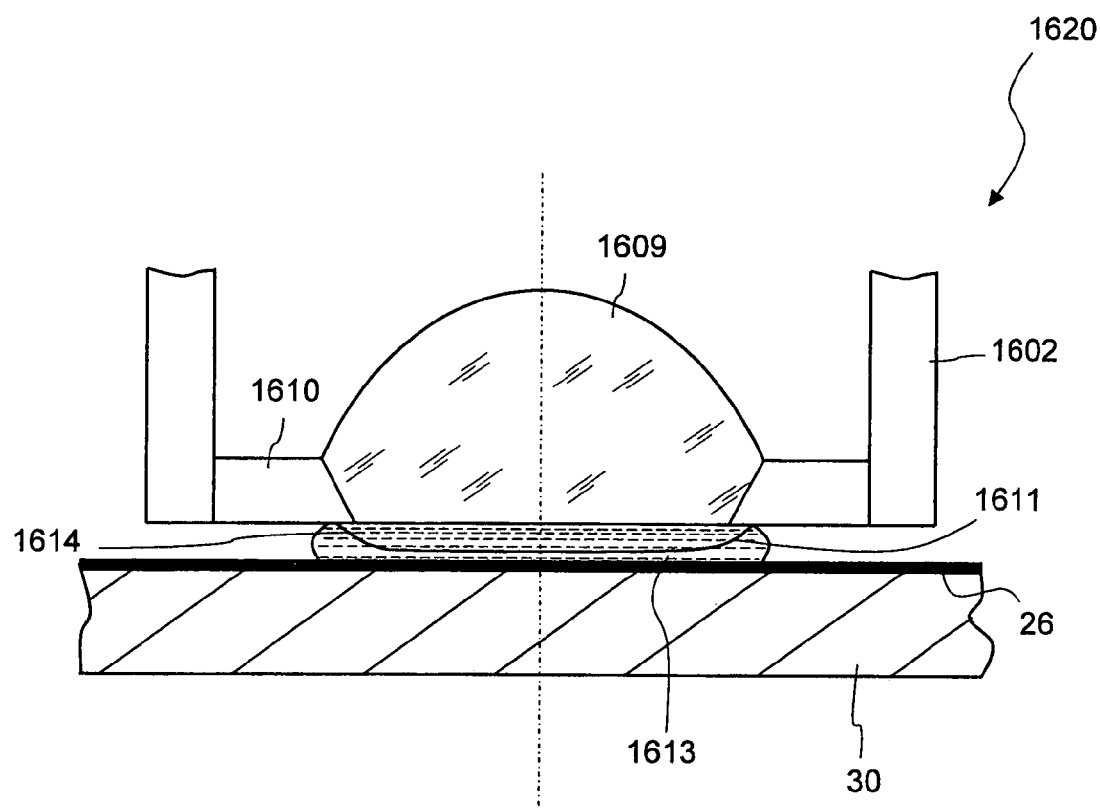
FIG. 21 the image-side end of a projection lens according to a fifteenth exemplary embodiment of the invention, wherein the terminating element is formed by a deformable membrane which is fixed to a housing of the projection objective.

FIG. 21 shows an image-side end of a projection objective 1620 according to a fifteenth embodiment. This embodiment mainly differs from the embodiment shown in FIG. 20 in that the membrane 1611 is not connected to a ring-shaped element mount, which is moved synchronously with the support 30, but to the underside of the housing 1602 of the projection objective 1620.

The membrane 1611 thus remains stationary during scanning movements of the support 30. Also in this embodiment the membrane 1611 ensures that the sensitive image-side surface of the final lens 1609 cannot be corroded by contacts with contaminated immersion liquid 1613.

The membrane 1611 connected to the housing 1602 facilitates the introduction of the liquid 1614 before the exposure operation begins. This particularly holds true if the image-side surface of the final lens 1609 is concavely curved.

Figure 22:
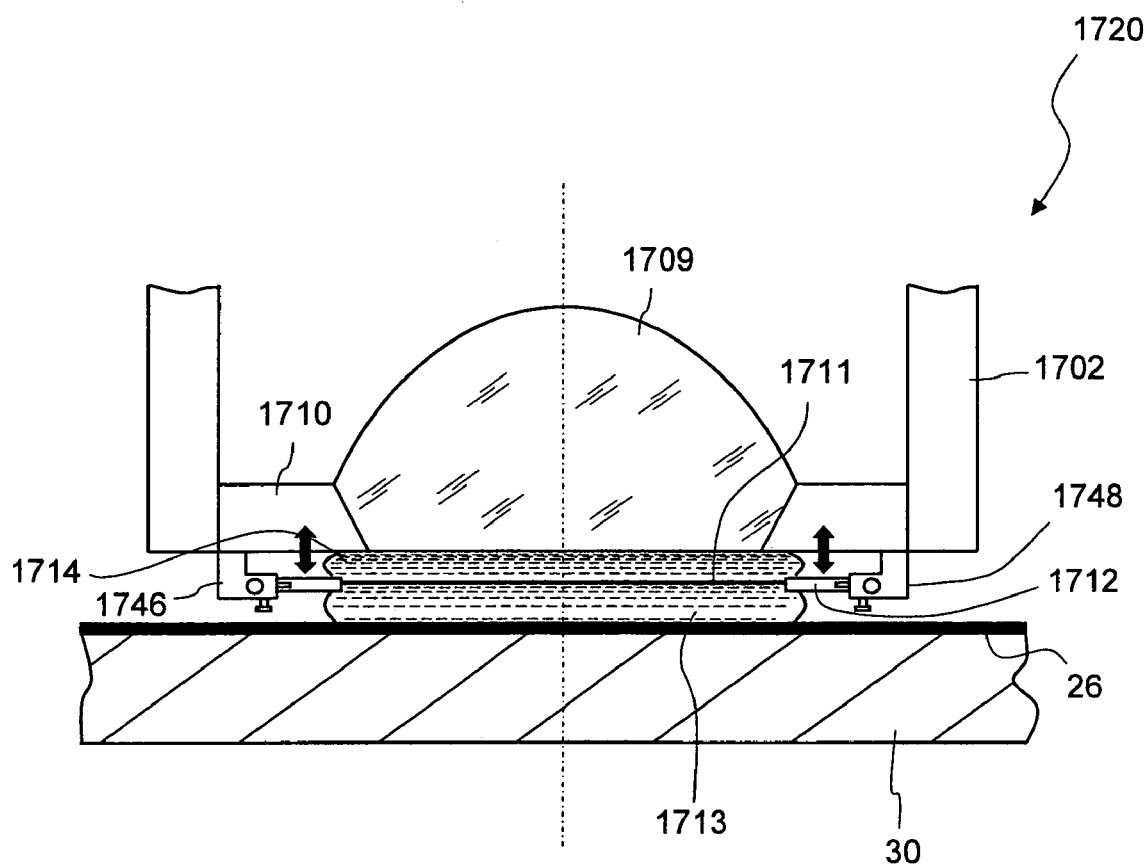
FIG. 22 the image-side end of a projection lens according to a sixteenth exemplary embodiment of the invention, wherein the terminating element is formed by a deformable membrane which is fixed in an adjustable frame.

FIG. 22 shows an image-side end of a projection objective 1720 according to a sixteenth embodiment. This embodiment differs from the embodiment shown in FIG. 21 mainly in that the membrane 1711 is not immediately attached to the underside of the projection objective 1720. Instead, the membrane 1711 is received in a frame 1712, which may be circular or rectangular, for example. The frame 1712 is connected to the projection objective 1720 through fastening elements 1746, 1748 that may be configured similar to the fastening elements 46, 48 shown in FIG. 2. More particularly, the fastening elements 1746, 1748 may include fine- adjustment drives such that the frame 1712 can be, together with the membrane 1711, accurately adjusted as desired. Thus it is possible to adjust the membrane 1711 such that it is exactly parallel to the light sensitive layer, or such that it forms a desired tilt angle with the final lens 1709. Tilting the membrane 1711 may be advantageous with regard to the correction of certain aberrations. The projection objective 1720 includes a housing 1702 and a lens mount 1710, an immersion liquid 1713 and a liquid 1714.

Alternatively to what is shown in FIG. 22, the fastening elements 1746, 1748 that enable the adjustment of the frame 1720 may be connected to the support 30 such that the membrane 1711 moves synchronously with the support 30 during the exposure operation. Further, it is to be understood that only one or more than two fastening elements may be provided in various configurations around the membrane 1711. Other means for adjusting the membrane 1711 are envisaged as well, for example by establishing a desired pressure distribution in the liquids.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An apparatus, comprising:
    a housing,
    a final lens element,
    a terminating element having a first surface and no overall refractive power that is positioned between, but spaced apart from, the final lens element and an image plane of the apparatus;
    a fastening member which is fixedly attached to the housing of the apparatus and supports the terminating element in an adjustable manner such that the position of the terminating element with respect to the fastening member is adjustable;
    a first liquid between the terminating element and the final lens element;
    a second liquid contacting a second surface of the terminating element, the second liquid extending to the image plane of the apparatus, the second surface of the terminating element is opposite the first surface of the terminating element,
    wherein the apparatus is a projection lens of a microlithographic projection exposure system.
2. The apparatus according to claim 1, wherein the fastening member comprises a micrometer screw.
3. The apparatus of claim 2, wherein the terminating element is a flexible membrane.
4. An apparatus, comprising:
    an illumination system to generate projection light, and
    a projection lens, the projection lens comprising:
        a final lens element,
        a deformable membrane having no overall refractive power that is positioned between, but spaced apart from, the final lens element and an image plane of the projection lens, and is received in a frame that is configured to be tilted around a tilt axis, and
        a liquid in an interspace formed between the final lens element and the deformable membrane,
    wherein the apparatus is a microlithographic projection exposure system.
5. The apparatus of claim 4, further comprising a fastening member which is fixedly attached to the housing of the apparatus and supports the flexible membrane in an adjustable manner such that the position of the flexible membrane with respect to the fastening member is adjustable.
6. The apparatus of claim 5, wherein the fastening member comprises a micrometer screw.
7. An apparatus, comprising:
    a housing,
    a final lens element,
    a terminating element having no overall refractive power that is positioned between, but spaced apart from, the final lens element and an image plane of the apparatus;
    a fastening member which is fixedly attached to the housing of the apparatus and supports the terminating element in an adjustable manner such that the position of the terminating element with respect to the fastening member is adjustable; and
    a liquid between the terminating element and the image plane, the liquid extending without interruption to the image plane of the apparatus,
    wherein the apparatus is a projection lens of a microlithographic projection exposure system.
8. The apparatus of claim 7, wherein the fastening member comprises a micrometer screw.

* * * * *

UNITED STATES PATENT AND TRADEMARK OFFICE
CERTIFICATE OF CORRECTION

PATENT NO.          : 7,570,343 B2                                                Page 1 of 1
APPLICATION NO. : 11/285283
DATED               : August 4, 2009
INVENTOR(S)       : Aurelian Dodoc It is certified that error appears in the above-identified patent and that said Letters Patent is hereby corrected as shown below:

Title Pg, Item (73) Assignee, Column 1, Line 1, delete "Zeis" insert --Zeiss--.

Title Pg, Item (56) Ref Cited, Page 2, Line 1, above "DE 224 448 A1 * 7/1985" delete "DE 224 448 A 7/1985".

Column 1, Line 13, delete "10 200 405 64 76" insert --10 2004 156 476--.

Column 7, Line 15, delete "underpressure" insert --under pressure--.

Column 17, Line 15, delete "covet" insert --cover--.

Column 19, Line 19, delete "2/099450" insert --02/099450--.

Column 23, Line 13-17, delete "The membrane 1611........liquid 1613." insert the same at Col. 23, Line 12, after "1620." as a continuation of the above paragraph.

Column 23, Line 31, delete "fine- adjustment" insert --fine-adjustment--.

Column 24, Line 15, Claim 1, delete "opposite the" insert --opposite to the--.

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,570,343 B2
APPLICATION NO. : 11/285283
DATED : August 4, 2009
INVENTOR(S) : Aurelian Dodoc et al.

It is certified that error appears in the above-identified patent and that said Letters Patent is hereby corrected as shown below:

Column 1, Line 13, delete "10 2004 156 4 76" insert --10 2004 056 476--.

Signed and Sealed this

Fifth Day of January, 2010

David J. Kappos
*Director of the United States Patent and Trademark Office*